United States Patent [19]

Washizu et al.

[11] Patent Number: 5,376,495
[45] Date of Patent: Dec. 27, 1994

[54] LIGHT-SENSITIVE HEAT-SENSITIVE RECORDING MATERIAL

[75] Inventors: Shintaro Washizu; Jun Yamaguchi; Kazuyuki Koike; Keiichiro Ozawa; Tetsuro Fuchizawa, all of Shizuoka, Japan

[73] Assignee: Fuji Photo Film Co., Ltd., Kanagawa, Japan

[21] Appl. No.: 799,800

[22] Filed: Nov. 29, 1991

[30] Foreign Application Priority Data

| Nov. 29, 1990 | [JP] | Japan | 2-331421 |
| Nov. 29, 1990 | [JP] | Japan | 2-331422 |
| Dec. 14, 1990 | [JP] | Japan | 2-402413 |
| Feb. 5, 1991 | [JP] | Japan | 3-35335 |

[51] Int. Cl.$^5$ .............................................. G03C 1/72
[52] U.S. Cl. .................................... 430/138; 430/281; 430/333; 430/336; 430/338; 430/533; 430/642
[58] Field of Search ............... 430/138, 351, 333, 336, 430/281, 533, 642, 538, 338

[56] References Cited

U.S. PATENT DOCUMENTS

| 4,645,731 | 2/1987 | Bayless et al. | 430/533 |
| 4,737,484 | 4/1988 | Iwasaki et al. | 430/138 |
| 4,780,402 | 10/1988 | Remmington | 430/533 |
| 4,910,117 | 3/1990 | Dowler et al. | 430/138 |
| 4,912,011 | 3/1990 | Yamamoto et al. | 430/281 |
| 5,091,280 | 2/1992 | Yamaguchi et al. | 430/138 |

Primary Examiner—Janis Dote
Attorney, Agent, or Firm—Sughrue, Mion, Zinn, Macpeak & Seas

[57] ABSTRACT

A light-sensitive heat-sensitive recording material is disclosed, which contains microcapsules resulting from a solution containing at least one component capable of undergoing color development or achromatization as a core material of the microcapsules and a volatile solvent which has a water solubility of 10% by volume or less and has a low boiling point such that it volatilizes during a process for preparing said light-sensitive heat-sensitive recording material leaving substantially no trace of the solvent in the resulting recording material. As the microcapsules, ones having a mean particle size of 2 μm or less are preferred, and ones prepared using a modified gelatin as a protective colloid are also preferred. Further, as the support of the light-sensitive heat-sensitive recording material, a polyester support filled with a white pigment can preferably be used.

11 Claims, No Drawings

LIGHT-SENSITIVE HEAT-SENSITIVE RECORDING MATERIAL

FIELD OF THE INVENTION

This invention relates to a light-sensitive heat-sensitive recording material which can be used for a color or black-and-white proof, a slide, an overhead projector, a secondary drawing, a copying machine, facsimile and the like.

BACKGROUND OF THE INVENTION

Prior art recording materials are described below using a color proof as exemplary since almost the same description can be made with regard to other materials in the field except for their uses.

An overlay system is a typical example of a color proof system. In this system, different monochrome films are laminated to produce a multi-color image which has a poor image quality because it must be seen through films.

A surprint system is known as another type of color proof system in which a multi-color image is provided on a single sheet. In this system, a multicolor image is obtained by laminating images of different colors one by one on a single support. For example, Chromalin (Du Pont Co.), Match Print (3M), Color Art (Fuji Photo Film Co., Ltd.) and the like are known examples of this type of color proof system, but each of them requires four light-sensitive films for corresponding colors. This results in the generation of waste materials.

In addition, a color paper system is known as a process for the formation of a color image on a single light-sensitive sheet. In this system, a film original is superposed closely on a sheet of color paper, exposure is effected using different color filters and then a color image is obtained by wet development. Fine Checker (Fuji Photo Film Co., Ltd.), Consensus (Konica Corp.) and the like are known as examples of this type of system. However, since the color paper is sensitive to visible light, this system requires a darkroom or an exposure apparatus equipped with a darkroom, as well as the necessity to maintain a developing solution.

As a consequence, these prior art systems nave certain disadvantages such as the necessity of using a plurality of sheets, the generation of waste materials including transfer sheets and toners, difficulty in handing in daylight, necessity to establishing a developing system using developing solution and the like.

A process has been proposed solving these prior art problems. According to this process, an absolute dry system which does not generate any waste material is achieved by using: (a) a light-sensitive heat-sensitive recording material of the type in which a latent image is formed upon exposure in a photo-hardenable composition and, when heated, a component capable of undergoing color development or achromatization moves inside the light-sensitive heat-sensitive material in response to the latent image to form an image; and (b) a process for the preparation of color images which compresses exposing the light-sensitive heat-sensitive recording material through an image original, forming a latent image on the exposed portion by light-sensitive hardening and thereafter forming a visible image by heating the recording material to disperse the component capable of undergoing color development or achromatization remaining the un-hardened portion.

There are several illustrative examples of this type of recording material, and they are not only applicable to a recording system for a black-and-white image but also especially effective when used as a color recording material.

An illustrative example of this type of recording material is disclosed in JP-A 52-89915 (the term "JP-A" as used herein means an "unexamined published Japanese patent application") in which two components of a two component type heat-sensitive recording material, for example, an electron accepting compound and an electron donating colorless dye, are separately arranged inside and outside or on both sides of microcapsules containing a photo-hardenable composition. In this recording material, however, the non-image portions are slightly colored thus showing a tendency for the contrast of the resulting image to be lowered, because development of color on the hardened portions cannot be prevented to a sufficient level even when the photo-hardenable composition in the microcapsules is hardened sufficiently.

A more preferred recording material which does not develop color in the non-image portions is disclosed, for instance, in JP-A-61-123838 in which a layer containing a photopolymerizable composition comprising an acid group-containing vinyl monomer and a photopolymerization initiator, an insulating layer and a layer comprising an electron donating colorless dye are laminated. In this type of recording material, thermal dispersion of the acid group becomes negligible in the non-image portion, i.e., in the hardened portion of the photopolymerizable layer. Although a color is not developed in the non-image portion because of such an effect, this recording material has the disadvantage of a somewhat low color density.

An example of a process for the formation of negative images in a similar manner is disclosed, for instance, in JP-A-60-119552 which comprises using a recording material in which a photopolymerizable composition comprising a monomer or a prepolymer capable of bleaching a dye and the dye to be bleached by the monomer or prepolymer are separately located. This recording material, however, has the same disadvantages as those of the above-described recording materials.

A recording material disclosed in Japanese Patent Application No. 1-224930 (corresponding to U.S. patent application Ser. No. 07/567,040, which is now U.S. Pat. No. 5,091,280) may be regarded as a most preferred material in which these problems concerning coloring of a non-image portion and low color density were resolved. This recording material is a two component type heat-sensitive recording material in which one of the two components is included in microcapsules and the other component is arranged outside the microcapsules as a hardenable compound of a photo-hardenable composition or together with the photo-hardenable composition.

Also, a recording material for negative image formation developed by employing a similar idea is disclosed in Japanese Patent Application No. 2-19710 (corresponding to U.S. patent application Ser. No. 07/567,040, now U.S. Pat. No. 5,091,280) in which a photopolymerizable composition comprising an electron accepting compound, a polymerizable vinyl monomer and a photopolymerization initiator is arranged outside of microcapsules, and a Layer containing the photopolymerizable composition and the microcapsules, which include an electron donating colorless dye, is coated on a support.

When color recording is attempted using one of these prior art recording materials, a recording material which comprises a plurality of light-sensitive layers each having different sensitive wave length and hue may basically be selected. More preferable multi-color recording materials are disclosed, for instance, in Japanese Patent Application Nos. 1-224930 and 2-19710, such as a multi-color recording medium which comprises a plurality of light-sensitive layers each of them sensitive to different wave length of light and capable of developing different color wherein the color recording medium comprises a layer structure of at least two light-sensitive layers laminated on a support, the layer structure comprising a first light-sensitive layer which is sensitive to light of a central wave length of $\lambda 1$, an intermediate layer which absorbs light of a central wave length of $\lambda 1$, a second light-sensitive layer which is sensitive to light of a central wave length of $\lambda 2$ and develops a different color from the first light-sensitive layer . . . , an intermediate layer which absorbs a light of central wave length of $\lambda i-1$ and an i-th light-sensitive layer which is sensitive to a light of central wave length of $\lambda i$ and develops a different color from the first, second, . . . , and (i-1)-th light-sensitive layers, in that order starting from the side of exposure to light toward the support side of the recording material, the central wave lengths being in the order of $\lambda 1 < \lambda 2 < \ldots < \lambda i$ where i is an integer of 2 or more.

These prior art light-sensitive heat-sensitive recording materials, however, have the disadvantage of poor resolution due, probably, to the restriction of the size of picture element by the limited particle size of microcapsules to be used, as well as another problem of poor image quality due to light scattering. These problems are important problems to be solved especially when high resolution is required such as in the case of proofs and slides.

With such light-sensitive heat-sensitive recording materials, heat development is carried out at a temperature of from 100° to 200° C. after light-sensitive recording. During the heat development process, a solvent present in microcapsules evaporates and condenses on the inner wall of a heat developing machine which subsequently causes not only staining of the recording material and the developing machine but also the generation of an offensive odor when volatilized into the air around the developing machine. In an extreme condition, the volatilized solvent will even damage the health of persons around the machine.

In addition to these problems, these prior art light-sensitive heat-sensitive recording materials have a tendency to be cloudy or hazy, probably, due to the existence of particles such as microcapsules and emulsified components in their coat layers. Since this type of haze decreases the visibility of images, application of these sensitive materials especially to overhead projection (OHP), slides and the like, which require transmission images, results in a dark and unclear total image due to poor transmission of light due to the haze.

These disadvantages of the prior art materials are fatal especially with a multilayer light-sensitive heat-sensitive color recording material, because the disadvantages in each layer of the recording material are compounded.

As a result, resolution of these problems has been desired in the area especially of color recording materials, not to mention monochrome recording materials.

On the other hand, although these recording materials can be used in many applications, they are generally applied to the formation of reflection images in which images are formed on a white paper support. Since these prior art light-sensitive heat-sensitive recording materials form images by—recording with light, formation of high resolution images could expected. However, a light-sensitive heat-sensitive recording material in which the above-described light-sensitive heat-sensitive layers are formed on a paper support as a typical white support produces uneven images with poor resolution, thus requiring further improvements.

As a means to resolve such unevenness and poor resolution, use of a support laminated with a polyolefin such as polyethylene or polypropylene has been proposed. However, since light-sensitive heat-sensitive recording materials to which the present invention is related require a heat development step, for example, at 120° C. for 5 seconds, the laminated polyethylene or polypropylene cannot tolerate the heat development temperature and therefore its shape begins to change thus resulting in wavy or distorted recording layers.

Another measure to resolve such poor resolution and unevenness involved use of a synthetic paper which is well known in this field. Thus, however, still results in deformation at the time of heat development to such a degree that the recording material cannot be used.

In addition, there is still another problem to be solved in use of a paper support or a laminated paper, that is, formation of fog which occurs when heat development is carried out an extended period of time after the formation of the latent image by exposure.

On the other hand, although these recording materials can be used in many applications, they are generally used in the form of a multi-layer structure involving an overcoat layer, an undercoat layer, an intermediate layer and the like. In this case, layers should be coated onto a support in a multi-layer structure. However, if each of the layers is separately coated one after another, there is disadvantageous in terms of cost and yield.

In the field of silver halide photographic materials, all of coating solutions for layers to be provided are formulated in a gelatin system and they are simultaneously coated onto a support by multi-coating technique utilizing a low-temperature setting property of gelatin. Accordingly, if this technique is employed, simultaneous multi-layer-coating can be conducted in the preparation of the above-mentioned recording materials.

However, if gelatin itself is used as a protective colloid for emulsifying and dispersing a component capable of undergoing color development or achromatization to be microencapsulated, a reactant existing as a capsule wall-forming material (e.g., an isocyanate) rapidly reacts with gelatin at the beginning of the emulsification, whereby flocculation of components occurs and microencapsulation is hardly conducted.

Accordingly, there have been required to attain a microencapsulation technique using gelatin protective colloid.

SUMMARY OF THE INVENTION

In view of the above, it therefore an object of the present invention is to provide a light-sensitive heat-sensitive black-and-white or color recording material of dry treatment type which neither generates waste materials nor requires a developing solution and the like and which forms a clear image with high resolution and less light scattering.

Another object of the present invention is to provide a light-sensitive heat-sensitive black-and-white or color recording material of the dry treatment type which neither generates waste materials nor requires a developing solution and the like in which environmental pollution is taken into consideration. Also provided are a light-sensitive heat-sensitive recording material which can be used to form an image with low haze and high visibility and a light-sensitive heat-sensitive recording material that can be applied to projection type purposes such as OHP's, slides and the like.

Still another object of the present invention is to provide a light-sensitive heat-sensitive black-and-white or color recording material of the dry treatment type which neither generates waste materials nor requires a developing solution and the like and which provides a high resolution image. Also provided is a light-sensitive heat-sensitive recording material which provides a clear image with no unevenness, a recording material which does not deform at the time of heat development and a light-sensitive heat-sensitive recording material which can provide a clear image with no fog formation even when a prolonged period of time exists between exposure and heat development.

A still further object of the present invention is to provide a process for preparing microcapsules using a gelatin protective colloid which does not cause aggregation or troubles such as unevenness and repellence of coating solution. Also provided are a light-sensitive heat-sensitive black-and-white or color recording material of the dry treatment type which neither generates waste materials nor requires a developing solution and the like and which employs microcapsules prepared by the process.

The objects of the present invention is accomplished by (1) a light-sensitive heat-sensitive recording material of the type in which a latent image is formed upon exposure in a photo-hardenable composition and, when heated, a component capable of undergoing color development or achromatization moves inside the light-sensitive heat-sensitive recording material in response to the latent image to form an image, wherein the light-sensitive heat-sensitive recording material comprises a support having on at least one side thereof a light-sensitive heat-sensitive layer comprising microcapsules containing at least one component capable of undergoing color development or achromatization, the microcapsules resulting from a solution containing at least one component capable of undergoing color development or achromatization as a core material of the microcapsules and a volatile solvent which has a water solubility of 10% by volume or less and has such a low boiling point that it volatilizes during the process for preparing the light-sensitive heat-sensitive recording material leaving substantially no trace of the solvent in the resulting recording material, or (2) a light-sensitive heat-sensitive recording material of the type in which a latent image is formed upon exposure in a photo-hardenable composition contained outside of the microcapsules and, when heated, an electron accepting compound moves inside the light-sensitive heat-sensitive recording material in response to the latent image to form an image by developing color of an electron donating colorless dye present in the microcapsules, wherein the light-sensitive heat-sensitive recording material comprises a support having on at least one side thereof a light-sensitive heat-sensitive layer comprising microcapsules resulting from a solution containing at least one electron donating colorless dye as a core material of the microcapsules and a volatile solvent which has a water solubility of 10% by volume or less and has such a low boiling point that it volatilizes during the process for preparing the light-sensitive heat-sensitive recording material leaving substantially no trace of the solvent in the resulting recording material.

The objects of the present invention are also accomplished by the above-mentioned light-sensitive heat-sensitive recording materials in which the microcapsules have a mean particle size of 2 $\mu$m or less.

The objects of the present invention are further accomplished by the above-mentioned light-sensitive heat-sensitive recording material in which the support is a polyester support filled with a white pigment.

The objects of the present invention are furthermore accomplished by the above-mentioned light-sensitive heat-sensitive recording material in which a support is provided with a flatting surface layer.

The objects of the present invention are still furthermore accomplished by a method for preparing microcapsules using a modified gelatin as a protective colloid in the emulsification and dispersion step and by the light-sensitive heat-sensitive recording material comprising microcapsules prepared using a modified gelatin as a protective colloid in the emulsification and dispersion step.

DETAILED DESCRIPTION OF THE INVENTION

By the use of the light-sensitive heat-sensitive recording material of the present invention, haze can be reduced to such a level that the material can be applied to projection use such as OHP's, slides and the like. In other words, prior art problems with respect to solvent vaporization and haze formation are simultaneously resolved by the use of the recording material of the present invention.

An illustrative example in relation to the recording material of the present invention is disclosed, for instance, in Japanese Patent Application No. 1-224930 (corresponding to U.S. patent application Ser. No. 07/567,040, now U.S. Pat. No. 5,091,280) in which a layer is laminated on a support wherein the layer comprises microcapsules containing an electron donating colorless dye and a light-hardenable composition arranged outside of the microcapsules, the light-hardenable composition comprising a compound having an electron accepting moiety and a polymerizable vinyl monomer moiety both in the molecule thereof and a photopolymerization initiator. When this recording material is exposed to light, the exposed portion of the light-hardenable composition arranged outside of the microcapsules is polymerized to form a latent image and, when the thus exposed material is heated, the compound having an electron accepting moiety moves inside the light-sensitive heat-sensitive recording material in response to the latent image to form a positive image with excellent contrast by developing the color of an electron donating colorless dye present in the microcapsules.

In addition, a negative image can be formed making use of a similar process using the recording material of the present invention. An illustrative example of such a process is disclosed, for instance, in Japanese Patent Application No. 2-19710 (corresponding to U.S. patent application Ser. No. 07/567,040, now U.S. Pat. No. 5,091,280) in which a recording material is prepared by coating a support with a layer which comprises microcapsules containing an electron donating colorless dye and a light-hardenable composition arranged outside of the microcapsules, the light-hardenable composition comprising an electron accepting compound, a polymerizable vinyl monomer and a photopolymerization initiator. When this recording material is exposed to light, the exposed portion of the light-hardenable composition arranged outside of the microcapsules is polymerized to form a latent image and, when the thus exposed material is heated, an electron accepting compound in the polymerization portion moves inside the light-sensitive heat-sensitive material in response to the latent image to form a negative image with excellent contrast by developing the color of an electron donating colorless dye present in the microcapsules.

As has been described above, various processes can be employed in the production of the recording material of the present invention, that is, "a light-sensitive heat-sensitive recording material of the type in which a latent image is formed upon exposure in a photo-hardenable composition and, when heated, a component capable of undergoing color development or achromatization moves inside the light-sensitive heat-sensitive material in response to the latent image to form an image".

The light-sensitive heat-sensitive layer used in the recording material of the present invention is not strictly limited to the above described construction and various constructions, may arise depending on each object.

The recording material for use in the present invention may be either a monochrome, the so-called B/W, recording material or a multicolor recording material. In the case of a multicolor recording material, it may, for example, comprise multilayers in which each layer comprises microcapsules containing an electron donating colorless dye which develops a different color from the other layers and a photo-hardenable composition that responds to different wave lengths of light. Examples of such constructions include: a construction in which a first light-sensitive heat-sensitive layer comprising microcapsules containing a cyan-developing electron donating colorless dye and a photo-hardenable composition which responds to light of a central wave length $\lambda 1$ is coated on a support, a second light-sensitive heat-sensitive layer comprising microcapsules containing a magenta-developing electron donating colorless dye and a photo-hardenable composition which responds to light of a central wave length $\lambda 2$ is coated on the first light-sensitive heat-sensitive layer and a third light-sensitive heat-sensitive layer comprising microcapsules containing a yellow-developing electron donating colorless dye and a photo-hardenable composition which responds to light of a central wave length $\lambda 3$ is further coated on the second light-sensitive heat-sensitive layer; a construction in which intermediate layers are interposed between these light-sensitive heat-sensitive layers; and a construction in which a UV-absorbing agent is present in the intermediate layers.

In the case of a multicolor recording material, the just described construction in which a UV-absorbing agent is present in intermediate layers is most preferable, such as a construction in which a first light-sensitive heat-sensitive layer comprising microcapsules containing a cyan-developing electron donating colorless dye and a photo-hardenable composition which responds to light of a central wave length $\lambda 1$ is coated on a support, a first intermediate layer containing a UV-absorbing agent which absorbs light of shorter range of wave length than $\lambda 1$ is coated on the first light-sensitive heat-sensitive layer, a second light-sensitive heat-sensitive layer comprising microcapsules containing a magenta-developing electron donating colorless dye and a photo-hardenable composition which responds to light of a central wave length $\lambda 2$ is coated on the first intermediate layer, a second intermediate layer containing a UV-absorbing agent which absorbs shorter range of light of wave length than $\lambda 2$ is coated on the second light-sensitive heat-sensitive layer, a third light-sensitive heat-sensitive layer comprising of microcapsules containing a yellow-developing electron donating colorless dye and a photo-hardenable composition which responds to light of a central wave length $\lambda 3$ is coated on the second intermediate layer, and then a protective layer is coated on the third light-sensitive heat-sensitive layer. Preferably, all of the central wavelengths $\lambda 1$, $\lambda 2$ and $\lambda 3$ of the light-sensitive heat-sensitive recording material of the present invention are 320 nm or more, both of $\lambda 1$ and $\lambda 2$ are less than 400 nm and $\lambda 3$ is 400 nm or more.

One particular embodiment of the present invention is a light-sensitive heat-sensitive recording material which comprises a layer structure of at least two light-sensitive heat-sensitive layers laminated on a support, the layer structure comprising a first light-sensitive heat-sensitive layer which is sensitive to light of a central wave length of $\lambda 1$, an intermediate layer which absorbs light of a central wave length of $\lambda 1$, a second light-sensitive heat-sensitive layer which is sensitive to light of a central wave length of $\lambda 2$ and develops a different color from the first light-sensitive heat-sensitive layer, an intermediate layer which absorbs light of a central wave length of $\lambda i-1$ and an i-th light-sensitive heat-sensitive layer which is sensitive to light of a central wave length of $\lambda i$ and develops a different color from the first, second and (i-1)-th light-sensitive heat-sensitive layers, in that order from the side of exposure light toward the support side of the recording material, the central wave lengths being in the order of $\lambda 1 < \lambda 2 < ... < i$ where i is an integer of 2 or more. Where i is 3, all of the central wave lengths $\lambda 1$, $\lambda 2$ and $\lambda 3$ of the light-sensitive heat-sensitive layers can be 320 nm or more, wherein both $\lambda 1$ and $\lambda 2$ are less than 400 nm and $\lambda 3$ is 400 nm or more.

An electron accepting and polymerizable vinyl monomer used mainly in a positive type recording material of the present invention may be selected from those compounds in which an electron accepting group and a vinyl group are present in the same molecule. Illustrative examples of such compounds include, for instance, a methacryloxyethyl ester of benzoic acid having a hydroxy group as disclosed in JP-A-63-173682 or an acryloxyethyl ester which can be synthesized using same method disclosed in JP-A-63-173682, an ester of benzoic acid having a hydroxy group and hydroxymethylstyrene as disclosed in JP-A-59-83693, JP-A-60-141587 and JP-A-62-99190, a hydroxystyrene as disclosed in European Patent 29323, an N-vinylimidazole complex of a zinc halide as disclosed in JP-A-62-167077 and JP-A-62-16708, a developer monomer as disclosed in JP-A-63-317558, and various other compounds synthesized based on these prior art compounds.

Illustrative examples of these compounds include styrenesulfonylaminosalicylic acid, vinylbenzyloxyphthalic acid, zinc β-methacryloxyethoxysalicylate, zinc β-acryloxyethoxysalicylate, vinyloxyethyloxybenzoate, β-methacryloxyethylorsellinate, β-acryloxyethylorsellinate, β-methacryloxyethoxyphenol, β-acryloxyethoxyphenol, β-methacryloxyethyl-β-resolcinate, β-acryloxyethyl-β-resolcinate, hydroxystyrenesulfonic acid-N-ethylamide, β-methacryloxypropyl-p-hydroxybenzoate, β-acryloxypropyl-p-hydroxybenzoate, methacryloxymethylphenol, acryloxymethylphenol, methacrylamidopropanesulfonate, acrylamidopropanesulfonate, β-methacryloxyethoxydihydroxybenzene, β-acryloxyethoxydihydroxybenzene, γ-styrenesulfonyloxy-β-methacryloxypropanecarbonate, γ-acryloxypropyl-α-hydroxyethyloxysalicylate, β-hydroxyethoxycarbonylphenol, β-methacryloxyethyl-p-hydroxycinnamate, β-acryloxyethyl-p-hydroxycinnamate, 3,5-distyrenesulfonic acid amidophenol, methacryloxyethoxyphthalic acid, acryloxyethoxyphthalic acid, methacrylic acid, acrylic acid, methacryloxyethoxyhydroxynaphthoic acid, acryloxyethoxyhydroxynaphthoic acid, 3-β-hydroxyethoxyphenol, β-methacryloxyethyl-p-hydroxybenzoate, β-acryloxyethyl-p-hydroxybenzoate, β'-methacryloxyethyl-βresorcinate, β-methacryloxyethyloxycarbonylhydroxybenzoic acid, β-acryloxyethyloxycarbonylhydroxybenzoic acid, N,N'-di-β-methacryloxyethylaminosalicylic acid, N,N'-di-β-acryloxyethylaminosalicylic acid, N,N'-di-β-methacryloxyethylaminosulfonylsalicylic acid, N,N'-di-β-acryloxyethylaminosulfonylsalicylic acid, and metal salts thereof, preferably zinc salts.

Photopolymerization initiators suitable for use in the recording material of the present invention may be selected from the compounds which can initiate photopolymerization of the aforementioned vinyl monomers. These compounds may be used alone or as a mixture of two or more thereof.

Illustrative examples of preferred photo-polymerization initiators include: aromatic ketones such as benzophenone, 4,4'-bis(dimethylamino)benzophenone, 4-methoxy-4'-dimethylaminobenzophenone, 4,4'-dimethoxybenzophenone, 4-dimethylaminobenzophenone, 4-dimethylaminoacetophenone, benzyl, anthraquinone, 2-tert-butylanthraquinone, 2-methylanthraquinone, xanthone, thioxanthone, 2-chlorothioxanthone, 2,4-diethylthioxanthone, fluorenone, acridone and the like; benzoin and benzoin ethers such as benzoin methyl ether, benzoin ethyl ether, benzoin isopropyl ether, benzoin phenyl ether and the like; 2,4,5-triarylimidazol dimers such as 2-(o-chlorophenyl)-4,5-diphenylimidazol dimer, 2-(o-chlorophenyl)-4,5-di(m-methoxyphenyl)imidazol dimer, 2-(o-fluorophenyl)-4,5-diphenylimidazol dimer, 2-(o-methoxyphenyl)-4,5-diphenylimidazol dimer, 2-(p-methoxyphenyl)-4,5-diphenylimidazol dimer and the like; polyhalogenides such as carbon tetrabromide, phenyltribromomethyl sulfone, phenyltrichloromethyl ketone and the like, and compounds disclosed in the specifications of JP-A-53-133428, JP-B-57-1819, JP-B-57-6096 and U.S. Pat. 3,615,455; and S-triazine derivatives having trihalogen-substituted methyl groups disclosed in JP-A-58-29803 such as 2,4,6-tris(trichloromethyl)-S-triazine, 2-methoxy-4,6-bis(trichloromethyl)-S-triazine, 2-amino-4,6-bis(trichloromethyl)-S-triazine, 2-(p-methoxystyryl)-4,6-bis(trichloromethyl)-S-triazine and the like. Also included are organic peroxides disclosed, for example, in JP-A-59-189340 such as methyl ethyl ketone peroxide, cyclohexanone peroxide, 3,3,5-trimethylcyclohexanone peroxide, benzoyl peroxide, di-tert-butyl-di-peroxyisophthalate, 2,5-dimethyl-2,5-di(benzoylperoxy)hexane, tert-butylperoxybenzoate, α,α'-bis(tert-peroxybutylisopropyl)benzene, dicumyl peroxide, 3,3',4,4'-tetra-(tert-butylperoxycarbonyl)benzophenone and the like. Also included are azinium compounds disclosed, for example, in U.S. Pat. No. 4,743,530, and organic boron compounds disclosed, for example, in European Patent 0,223,587 such as tetramethylammonium salts of triphenylbutylborate, tetrabutylammonium salts of triphenylbutylborate, tetramethylammonium salts of tri(p-methoxyphenyl)butylborate and the like. Other well known prior art photo polymerization initiators such as diaryliodonium salts and iron-allene complexes are also useful for the purposes of the present invention. (The term "JP-B" as used herein means an "examined Japanese patent publication".)

In addition, a combination of two or more compounds as a photopolymerization initiator system can be employed in the present invention. Examples of such a system include a combination of 2,4,5-triarylimidazole dimer and mercaptobenzoxazole or the like, a combination of 4,4'-bis(dimethylamino)benzophenone and benzophenone or benzoin methyl ether as disclosed in U.S. Pat. No. 3,427,161, a combination of benzoyl-N-methylnaphthothiazoline and 2,4-bis(trichloromethyl)-6-(4'-methoxyphenyl)triazol as disclosed in U.S. Pat. No. 4,239,850, a combination of dialkylaminobenzoic ester and dimethylthioxanthone as disclosed in JP-A-57-23602 and a triple combination of 4,4'-bis(dimethylamino)benzophenone, benzophenone and a polyhalogenated methyl compound as disclosed in JP-A-59-78339. A combination of 4,4'-bis(diethylamino)benzophenone and benzophenone, a combination of 2,4-diethylthioxanthone and 4-dimethylaminoethylbenzoate and a combination of 4,4'-bis(diethylamino)benzophenone and 2,4,5-triarylimidazole dimer are purticularly preferable.

Most preferred compounds of these photo-polymerization initiators are benzoin ethers, S-triazine derivatives having a trihalo-substituted methyl group, organic peroxides, azinium salt compounds and organic boron compounds.

The photopolymerization initiator is preferably used in an amount of from 0.01 to 20% by weight on the basis of the total weight of the photopolymerizable composition, more preferably from 0.2 to 15% by weight, most preferably from 5 to 10% by weight. Use of an amount less than 0.01% by weight causes insufficient sensitivity and use of an amount more than 20% by weight provide no proportionally increased sensitivity.

In addition to the polymerizable vinyl monomer and photopolymerization initiator, a spectral sensitization dye is also used in the photo-hardenable composition of the recording material of the present invention for the purpose of controlling the sensitive wave length. Such a spectral sensitization dye may be selected from various compounds known in art, by consulting, for example, the aforementioned patents cited in relation to photopolymerization initiators, *Research Disclosure*, vol. 200, Item 20036 (December, 1980) and *Zokanzai* (Sensitizer) (pages 160 to 163; edited by K. Tokumaru and S. Ohgawara, published by Kodansha in 1987; in Japanese).

Illustrative examples of spectral sensitization dyes include, for example, 3-keto-coumarin compounds disclosed in JP-A-58-15503, thiopyrylium salts disclosed JP-A-58-40302, naphthothiazole merocyanine compounds disclosed in JP-B-59-28328 and JP-B-60-53300 and merocyanine compounds disclosed in JP-B-61-9621, JP-B-62-3842, JP-A-59-89303 and JP-A-60-60104. By the use of these spectral sensitization dyes, the spectral sensitivity of a photopolymerization initiator can be extended to the visible wave length. Though trihalomethyl-S-triazine compounds are exemplified as photopolymerization initiators in the foregoing prior arts, these spectral sensitization dyes can also be used in combination with other photopolymerization initiators. Illustrative examples of spectral sensitization dyes include: keto dyes such as a coumarin dye (including ketocoumarin or sulfonocoumarin), a merostyryl dye, an oxonol dye and a hemioxonol dye; non-keto dyes such as a non-keto polymethine dye, an anthracene dye, a rhodamine dye, an acridine dye, an aniline dye and an azo dye; non-ketopolymethine dyes such as cyanine, hemicyanine and a styryl dye; and other dyes.

In addition, the photopolymerizable composition of the present invention may be used in combination with polymerization enhancing auxiliary agents such as reducing agents like an oxygen scavenger and chain transfer agents of an active hydrogen donor type, as well as other compounds which enhance the polymerization by chain transfer. Useful oxygen scavengers include phosphines, phosphonates, phosphites and stannous salts, as well as other compounds which can be oxidized easily by oxygen such as N-phenylglycine, trimethylbarbiturate, N,N-dimethyl-2,6-diisopropylaniline, N,N,N-2,4,6-pentamethylaniline and the like. Also useful polymerization enhancers are thiols, thioketones, trihalomethyl compounds, lophine dimer compounds, iodonium salts, sulfonium salts, azinium salts, organic peroxides and the like.

An electron accepting compound is preferably used in a negative type recording material of the present invention. Also, when required, such an electron accepting compound may be added to the photo-hardenable composition in a positive type recording material in order to increase the color density. Such electron accepting compounds include phenol derivatives, derivatives of salicylic acid, metal salts of aromatic carboxylic acids, acid clay, bentonite, novolak resins, metal-treated novolak resins, metal complexes and the like. Illustrative examples of these compounds are disclosed, for instance, in JP-B-40-9309, JP-B-45-14039, JP-A-52-140483, JP-A-48-51510, JP-A-57-210886, JP-A-58-87089, JP-A-59-11286, JP-A-60-176795 and JP-A-61-95988.

Illustrative examples of such phenolic compounds include 2,2'-bis(4-hydroxyphenyl)propane, 4-t-butylphenol, 4-phenylphenol, 4-hydroxydiphenoxide, 1,1'-bis(3-chloro-4-hydroxyphenyl)cyclohexane, 1,1'-bis(4-hydroxyphenyl)cyclohexane,1,1'-bis(3-chloro-4-hydroxyphenyl)-2-ethylbutane, 4,4'-sec-isooctylidene diphenol, 4,4'-sec-butylidene diphenol, 4-tert-octyl phenol, 4-p-methylphenyl phenol, 4,4'-methylcyclohexylidene phenol, 4,4'-isopentylidene phenol, benzyl p-hydroxybenzoate and the like. Illustrative examples of the salicylic acid derivatives include 4-pentadecylsalicylic acid, 3,5-di(α-methylbenzyl)-salicylic acid, 3,5-di(ter-octyl)salicylic acid, 5-octadecylsalicylic acid, 5-α-(p-α-methylbenzylphenyl)-ethylsalicylic acid, 3-α-methylbenzyl-5-ter-octyl-salicylic acid, 5-tetradecylsalicylic acid, 4-hexyloxysalicylic acid, 4-cyclohexyloxysalicylic acid, 4-decyloxysalicylic acid, 4-dodecyloxysalicylic acid, 4-pentadecyloxysalicylic acid, 4-octadecyloxysalicylic acid and the like, and zinc, aluminum, calcium, copper and lead salts of these salicylic acid compounds. These electron accepting compounds are preferably used in an amount of from 5 to 1000% by weight on the basis of the electron donating colorless dye.

The photo-hardenable composition of a negative recording material of the present invention may contain a monomer which has at least one vinyl group in the molecule. Such a monomer may be selected, for example, from acrylic acid and its salts, acrylic esters, acrylamides, methacrylic acid and its salts, methacrylic esters, methacrylamides, maleic anhydride, maleic esters, itaconic acid, itaconic esters, styrenes, vinyl ethers, vinyl esters, heterocyclic N-vinyl compounds, aryl ethers, allyl esters and the like.

Of these, a monomer having a plurality of vinyl groups in the molecule is preferably used. Such a compound is selected, for example, from acrylic esters and methacrylic esters of polyhydric alcohols such as trimethylolpropane and pentaerythritol; epoxy resins with acrylate or methacrylate terminals; polyesters with acrylate or methacrylate terminals and the like, with most preferable compounds including ethylene glycol diacrylate, ethylene glycol dimethacrylate, trimethylolpropane triacrylate, pentaerythritol tetraacrylate, dipentaerythritol hydroxypentaacrylate, hexanediol-1,6-dimethacrylate, diethylene glycol dimethacrylate and the like.

The molecular weight of the multifunctional monomer is preferably in the range of from about 100 to about 5,000, more preferably from about 300 to about 2,000.

In addition to these compounds, polyvinyl cinnamate, polyvinyl cinnamylideneacetate, a photo-hardenable composition with an α-phenylmaleimide group or the like may be used as a photo cross-linkable composition. The a photo cross-linkable composition may also be used as a photo-hardenable composition.

In addition to the above components, if desired, a heat polymerization inhibitor may also be added to the photo-hardenable composition. Such an inhibitor improves the chemical stability of the photo-hardenable composition during its preparation and storage because of the effect of the inhibitor to prevent thermal or time-dependent polymerization of the photo-hardenable composition. Illustrative examples of heat polymerization inhibitors include p-methoxyphenol, hydroquinone, t-butyl catechol, pyrogallol, 2-hydroxybenzophenone, 4-methoxy-2-hydroxybenzophenone, cuprous chloride, phenothiazine, chloranil, naphthylamine, β-naphthol, 2,6-di-t-butyl-p-cresol, nitrobenzene, dinitrobenzene, picric acid, p-toluidine and the like.

The heat polymerization inhibitor is preferably used in an amount of from 0.001 to 5% by weight, more preferably from 0.01 to 1% by weight, based on the total weight of the photo-hardenable composition. If the amount of the inhibitor is smaller than 0.001% by weight, this results in inferior heat stability and if the amount is larger than 5% by weight sensitivity is reduced.

When required, the photo-hardenable composition of the recording material of the present invention may be used by including it in microcapsules. Inclusion of the composition in microcapsules may be carried out by reference, for instance, to European Patent No. 0,223,587 and other patents described above.

Various known compounds are useful as the electron donating colorless dye used in the recording material of the present invention, such as triphenylmethanephthalide compounds, fluoran compounds, phenothiazine compounds, indolylphthalide compounds, leucoauramine compounds, rhodamine lactam compounds, triphenylmethane compounds, triazene compounds, spiropyran compounds, fluorene compounds and other compounds. Illustrative examples of these compounds are disclosed, for instance: phthalide compounds in U.S. Reissue Pat. No. 23,024, U.S. Pat. No. 3,491,111, U.S. Pat. No. 3,491,112, U.S. Pat. No. 3,491,116 and U.S. Pat. No. 3,509,174; fluoran compounds in U.S. Pat. No. 3,624,107, U.S. Pat. No. 3,627,787, U.S. Pat. No. 3,641,011, U.S. Pat. No. 3,462,828, U.S. Pat. No. 3,681,390, U.S. Pat. No. 3,920,510 and U.S. Pat. No. 3,959,571; spirodipyran compounds in U.S. Pat. No. 3,971,808; pyridine and pyrazine compounds in U.S. Pat. No. 3,775,424, U.S. Pat. No. 3,853,869 and U.S. Pat. No. 4,246,318; and fluorene compounds in Japanese Patent Application No. 61-240989 (corresponding to U.S. patent application Ser. No. 07/567,040).

Illustrative examples of these compounds include: triarylmethane compounds such as 3,3-bis(p-dimethylaminophenyl)-6-dimethylaminophthalide, 3,3-bis(p-dimethylaminophenyl)phthalide, 3-(p-dimethylaminophenyl)-3-(1,3-dimethylindole-3-yl)phthalide, 3-(p-dimethylaminophenyl)-3-(2-methylindole-3-yl)phthalide and the like; diphenylmethane compounds such as 4,4'-bis-dimethylaminobenzhydrin benzyl ether, N-halophenylleucoauramine, N-2,4,5-trichlorophenylleucoauramine and the like; xanthene compounds such as Rhodamine B anilinolactam, Rhodamine-(p-nitrino)-lactam, 2-(dibenzylamino)fluoran, 2-anilino-3-methyl-6-diethylaminofluoran, 2-anilino 3-methyl-6-dibutylaminofluoran 2-anilino-3-methyl-6-N-ethyl-N-isoamylaminofluoran, 2-anilino-3-methyl-6-N-methyl-N-cyclohexylaminofluoran, 2-anilino-3-chloro-6-diethylaminofluoran, 2-anilino-3-methyl-6-N-ethyl-N-isobutylaminofluoran, 2-anilino-6-dibutylaminofluoran, 2-anilino-3-methyl-6-N-methyl-N-tetrahydrofurfurylaminofluoran, 2-anilino-3-methyl-6-piperidinoaminofluoran, 2-(o-chloroanilino)-6-diethylaminofluoran, 2-(3,4-dichloroanilino)-6-diethylaminofluoran and the like; thiazine compounds such as benzoyl Leucomethylene Blue, p-nitrobenzyl Leucomethylene Blue and the like; spiropyran compounds such as 3-methyl-spiro-dinaphthopyran, 3-ethyl-spirodinaphthopyran, 3,3'-dichloro-spiro-dinaphthopyran, 3-benzylspiro-dinaphthopyran, 3-methyl-naphtho-(3-methoxy-benzo)spiropyran, 3-propyl-spiro-dibenzopyran and the like; and many other related compounds.

When electron donating colorless dyes are used in a full-color recording material, useful examples of dyes for use in cyan, magenta and yellow color development are disclosed, instance, in U.S. Pat. No. 4,800,149, those for yellow color development, for instance, in U.S. Pat. No. 4,800,148 and those for cyan use, for instance, in JP-A-63-53542.

The electron donating colorless dye used in the recording material of the present invention can be included in microcapsules using well known techniques such as methods disclosed in U.S. Pat. No. 2,800,457 and U.S. Pat. No. 2,800,458, in which coacervation of a hydrophilic wall forming material is employed; interfacial polymerization methods disclosed in U.S. Pat. No. 3,287,154, British Patent 990,443, JP-B-38-19574, JP-B-42-446 and JP-B-42-771; polymer precipitation methods disclosed in U.S. Pat. No. 3,418,250 and U.S. Pat. No. 3,660,304; a method disclosed in U.S. Pat. No. 3,796,669 in which an isocyanate polyol is used as a wall forming material; a method disclosed in U.S. Pat. No. 3,914,511 in which an isocyanate compound is used as a wall forming material; methods disclosed in U.S. Pat. No. 4,001,140, U.S. Pat. No. 4,087,376 and U.S. Pat. No. 4,089,802 in which a urea-formaldehyde system or a urea-formaldehyde-resorcinol system is used as a wall forming material; a method disclosed in U.S. Pat. No. 4,025,455 in which a melamine-formaldehyde resin, a hydroxypropyl cellulose or the like is used as a wall forming material; in situ monomer polymerization methods disclosed in JP-B-36-9168 and JP-A-51-9079; electrolytic dispersion cooling methods disclosed in British Patent 952,807 and British Patent 965,074; and spray drying methods disclosed in U.S. Pat. No. 3,111,407 and British Patent 930,422. Although not restricted, it is preferable to form polymer membranes as microcapsule walls after completion of core material emulsification.

The microcapsule wall of the microcapsules used in the present invention may be prepared effectively especially by the use of a method in which the wall is formed by polymerization of a reactant inside an oil drop. With such a method, capsules having a homogeneous particle size and excellent shelf life as a recording material can be obtained quickly.

For example, in the case of the use of polyurethane as the capsule wall material, microcapsule walls may be prepared by mixing a polyvalent isocyanate and, if necessary, a second material which forms a capsule wall by reacting with the isocyanate (for example, a polyol or a polyamine) with an oily liquid to be incorporated into the capsules, emulsifying and dispersing the resulting mixture in water and then increasing temperature of the emulsified dispersant to initiate the polymer formation reaction at the interface of oil drops. In this instance, an auxiliary solvent having a low boiling point and a high solubility may be added to the oily liquid.

Examples of polyvalent isocyanates, polyols and polyamines useful for this purpose are disclosed in U.S. Pat. No. 3,281,383, U.S. Pat. No. 3,773,695, U.S. Pat. No. 3,793,268, JP-B-48-40347, JP-B-49-24159, JP-A-48-80191 and JP-A-48-84086.

Illustrative examples of polyvalent isocyanates include: diisocyanates such as m-phenylenediisocyanate, p-phenylenediisocyanate, 2,6-tolylenediisocyanate, 2,4-tolylenediisocyanate, naphthalene-1,4-diisocyanate, diphenylmethane-4,4'-diisocyanate, 3,3'-dimethoxy-4,4'-biphenyldiisocyanate, 3,3'-dimethyldiphenylmethane-4,4'-diisocyanate, xylylene-1,4-diisocyanate, 4,4'-diphenylpropanediisocyanate, trimethylenediisocyanate, hexamethylenediisocyanate, propylene-1,2-diisocyanate, butylene-1,2-diisocyanate, cyclohexylene-1,2-diisocyanate, cyclohexylene-1,4-diisocyanate and the like; triisocyanates such as 4,4', 4"-triphenylmethanetriisocyanate, toluene-2,4,6-triisocyanate and the like; tetraisocyanates such as 4,4'-dimethyldiphenylmethane-2,2',5,5'-tetraisocyanate and the like; and isocyanate prepolymers such as an addition product of hexamethylenediisocyanate and trimethylolpropane, an addition product of 2,4-tolylenediisocyanate and trimethylolpropane, an addition product of xylylenediisocyanate and trimethylolpropane, an addition product of tolylenediisocyanate and hexanetriol and the like.

Illustrative examples of polyols include aliphatic and aromatic polyhydric alcohols, hydroxy polyesters, hydroxypolyalkylene ethers and the like.

The polyols disclosed in JP-A-60-49991 are also useful such as ethyleneglycol, 1,3-propanediol, 1,4-butanediol, 1,5-pentanediol, 1,6-hexanediol, 1,7-heptanediol, 1,8-octanediol, propyleneglycol, 2,3-dihydroxybutane, 1,2-dihydroxybutane, 1,3-dihydroxybutane, 2,2-dimethyl-1,3-propanediol, 2,4-pentanediol, 2,5-hexanediol, 3-methyl-1,5-pentanediol, 1,4-cyclohexanedimethanol, dihydroxycyclohexane, diethyleneglycol, 1,2,6-trihydroxyhexane, 2-phenylpropyleneglycol, 1,1,1-trimethylolpropane, hexanetriol, pentaerythritol, a pentaerythritol ethylene oxide addition product, a glycerol ethylene oxide addition product, glycerol, 1,4-di(2-hydroxyethoxy)benzene, a condensed product of alkylene oxide and an aromatic polyhydric alcohol such as resorcinol dihydroxyethyl ether or the like, p-xylyleneglycol, m-xylyleneglycol, α,α'-dihydroxy-p-diisopropylbenzene, 4,4'-dihydroxydiphenylmethane, 2-(p,p'-dihydroxydiphenylmethyl)benzylalcohol, an addition product of bisphenol A with ethylene oxide, an addition product of bisphenol A with propylene oxide and the like. Each polyol may be used in an amount such that its hydroxyl groups are 0.02 to 2 mols per one mol of isocyanate group.

Illustrative examples of polyamines which can be used in the present invention include ethylenediamine, trimethylenediamine, tetramethylenediamine, pentamethylenediamine, hexamethylenediamine, p-phenylenediamine, m-phenylenediamine, piperazine, 2-methylpiperazine, 2,5-dimethylpiperazine, 2-hydroxytrimethylenediamine, diethylenetriamine, triethylenetriamine, triethylenetetramine, diethylaminopropylamine, tetraethylenepentamine, amine-added products of epoxy compounds and the like. Polyisocyanates can be converted into high molecular weight compounds through reaction with water.

Water soluble polymers are useful for the preparation of microcapsules as a protective colloid in the emulsification and dispersion step. In this instance, any of anionic, nonionic and amphoteric water soluble polymers are suitable.

Suitable water soluble anionic polymers include both natural and synthetic polymers which, for example, have an —COO⁻ group, a —SO₂⁻ group and the like. Illustrative examples of water soluble anionic polymers include: natural polymers such as gum arabic, alginic acid, pectin and the like; semi-synthetic polymers such as carboxymethyl cellulose, phthalated gelatin, sulfated starch, sulfated cellulose, lignin sulfonate and the like; and synthetic polymers such as copolymers of maleic anhydride (including hydrolyzed products), polymers and copolymers of acrylic acid (including methacrylic acids), polymers and copolymers of vinylbenzenesulfonate, carboxy-modified polyvinyl alcohol and the like.

Suitable water soluble nonionic polymers, indicate polyvinyl alcohol, hydroxyethyl cellulose, methyl cellulose and the like.

Gelatin and the like are suitable as water soluble amphoteric polymers.

However, since the polyvalent isocyanate reacts with amino groups of gelatin very quickly, when gelatin as the protective colloid and the polyvalent isocyanate as the reactant to form the capsule wall are used in combination, the reaction between the isocyanate and the amino groups of gelatin occurs at the beginning of the emulsification and dispersion step and flocculation occurs. In order to avoid such flocculation, it is preferred to use a modified gelatin, i.e., a gelatin where the amino groups are selectively replaced by another group which does not react with the isocyanate. Specific examples of the modified gelatin include a phthalate modified gelatin, an acetylate modified gelatin, an oxalate modified gelatin, a malonate modified gelatin, a succinate modified gelatin, a glutarate modified gelatin, an adipate modified gelatin, a pimelate modified gelatin, a maleate modified gelatin, a fumarate modified gelatin, a benzoylate modified gelatin, and the like. Among them, a phthalate modified gelatin and a succinate modified gelatin are preferred. A modification ratio of these modified gelatins is 50% by mol or more, preferably 80% by mole or more, more preferably 95% by mole or more, based on the total amino groups of gelatin.

These water soluble polymers may be used as an aqueous solution of 0.01 to 15% by weight.

The size of capsules suitable for use in the recording material of the present invention may be 20 μm or less, preferably 5 μm or less, more preferably 2 μm or less. If the capsule size is too small, however, an unnecessarily large amount of wall material is required because the surface area per solid material is large. The capsule size, therefore, is preferably 0.1 μm or larger.

The electron donating colorless dye of the present invention may be present in the microcapsules in either a liquid or a solid form. When the electron donating colorless dye is used in a liquid form, it may be present in the capsules dissolved in a solvent. In this instance, the amount of the solvent is in the range of from 1 to 500 parts by weight based on 100 parts by weight of the electron donating colorless dye.

According to the present invention, when microcapsules are prepared, a single or a combination of volatile solvents which have a water solubility of 10% by volume or less measured at 25° C. and have a low boiling point such that they volatilize during the process for preparing the light-sensitive heat-sensitive recording material leaving substantially no trace of the solvent in the resulting recording material is preferably used as a solvent system of the microcapsule core material, namely, at least one component capable of undergoing color development or achromatization such as an electron donating colorless dye. Since the volatile solvents volatilize almost completely during the microcapsule preparation step and following coating and drying steps and therefore are substantially eliminated from the resulting recording material, evaporation of organic substances does not occur when the recording material of the present invention is subjected to heating for heat development. The term "substantially no trace of the solvent" as used herein means that the amount of the solvent in the resulting recording material is very low in an extent that it cannot be detected by means of a gas chromatography.

Commonly used high boiling point solvents may be used for the dissolution of core materials during microcapsule preparation in combination with the volatile solvent so long as the effects of the present invention are not deteriorated thereby.

The term "high boiling point solvent" as used herein is a solvent which is volatilized slowly during the process for the production of the light-sensitive heat-sensitive recording material, so that it remains in the resulting recording material in an amount, say 0.1 g/m² or more which can not be ignored. Such high boiling point solvents include natural or synthetic oil having a boiling point of 101° C. or higher, though the remaining amount cannot be defined specifically because it depends on the relationship between the boiling point of the solvent to be used and temperatures at the time of the capsule preparation and drying steps during which the solvent is evaporated. Examples of such solvents are cotton seed oil, kerosene, an aliphatic ketone, an aliphatic ester, paraffin, naphthene oil, an alkylated biphenyl, an alkylated terphenyl, a chlorinated paraffin, an alkylated naphthalene, a diarylethane, a phthalic acid alkyl ester, a phosphoric ester, a citric ester, a benzoic ester and the like, all of them having a boiling point of 101° C. or higher.

In addition, where a solvent having a boiling point of 100° C. or lower is used, a highly water soluble solvent such as methanol, acetone or the like is not very preferred as a solvent for use in the dissolution of a core material at the time of microcapsule preparation, because the core material precipitates in water and therefore cannot be emulsified. The present inventors have conducted intensive studies and found that excellent results can be obtained by the use of a solvent having a water solubility of 10% by volume or less.

The volatile solvent to be used in the present invention, which has a water solubility of 10% by volume or less and has a low boiling point such that it volatilizes during a process for preparing said light-sensitive heat-sensitive recording material leaving substantially no trace of the solvent in the resulting recording material, is preferably selected from solvents having a boiling point of 100° C. or lower. Preferred examples of such solvents include ethyl acetate, isopropyl acetate, t-butyl acetate, vinyl acetate, methylisobutyrate, methylacrylate, methylenechloride, carbon tetrachloride and the like, of which ethyl acetate, isopropyl acetate and methylenechloride are particularly preferred.

A matting agent is preferably included in the protective layer of the recording material of the present invention. Examples of matting agents include: inorganic compounds such as silica, magnesium oxide, barium sulfate, strontium sulfate, silver halide and the like; polymer particles such as those of polymethylmethacrylate, polyacrylonitrile, polystyrene and the like; and starch particles such as of carboxylated starch, corn starch, carboxynitrophenyl starch and the like, of which a particle size ranges from 1 to 20 μm. Among these matting agents, polymethylmethacrylate particles and silica particles are particularly preferred. Preferable silica particles are Siloid AL-1, 65, 72, 79, 74, 404, 620, 308, 978, 161, 162, 244, 255, 266, 150 and the like which are available from FUJI-DEVISON CHEMICAL, LTD. The matting agent is used preferably in an amount of from 2 to 500 mg/m², more preferably from 5 to 100 mg/m².

A curing agent is preferably used jointly in each of the layers of the recording material such as a light-sensitive heat-sensitive layer, an intermediate layer, a protective layer and the like, especially in the protective layer in order to reduce the stickiness of this layer in the recording material of the present invention. The so-called "gelatin curing agent" which is used for the production of photographic materials are useful as the curing agent. Examples of the curing agent include: aldehyde compounds such as formaldehyde, glutaraldehyde and the like; compounds having reactive halogens disclosed, for instance, in U.S. Pat. No. 3,635,718; compounds having reactive ethylenically unsaturated bonds disclosed, for instance, in U.S. Pat. No. 3,635,718; azilidine-based compounds disclosed, for instance, in U.S. Pat. No. 3,017,280; epoxy compounds disclosed, for instance, in U.S. Pat. No. 3,091,537; halogenocarboxyaldehydes such as mucochloric acid and the like; dioxanes such as dihydroxydioxane, dichlorodioxane and the like; vinyl sulfones disclosed, for instance, in U.S. Pat. No. 3,642,486 and U.S. Pat. No. 3,687,707; vinyl sulfone precursors disclosed in U.S. Pat. No. 3,841,872; keto vinyls disclosed in U.S. Pat. No. 3,640,720; and chrome alum, zirconium sulfate, boric acid and the like as inorganic curing agents. Of these curing agents, the most preferred compounds are 1,3,5-triacroyl-hexahydro-s-triazine, 1,2-bis-vinylsulfonylmethane, 1,3-bis(-vinylsulfonylmethyl)propanol-2, bis(α-vinylsulfonylacetamide)ethane, sodium 2,4-dichloro-6-hydroxy-s-triazine, 2,4,6-triethyleneimino-s-triazine, boric acid and the like. These compounds are used preferably in an amount of from 0.5 to 5% by weight based on the binder used.

In addition to these compounds, the protective layer may contain colloidal silica in order to reduce the stickiness of the layer. Snowtex 20, Snowtex 30, Snowtex C, Snowtex O, Snowtex N and the like manufactured by Nissan Chemical Industries, Ltd. can be used preferably. The colloidal silica may be used preferably in an amount of from 5 to 80% by weight based on the binder.

The protective layer may also include a fluorescent whitening agent and a blue dye as a blueing agent in order to increase the brightness of the recording material of the present invention.

In use of the recording material of the present invention as a multicolor recording material, the recording material may be made into multilayers which comprise light-sensitive heat-sensitive layers each containing microcapsules in which an electron donating colorless dye that develops a different hue a photo-hardenable composition having a different wave length sensitivity and, preferably, an intermediate layer containing a UV-absorbing agent interposed between these light-sensitive heat-sensitive layers.

The intermediate layer contains mainly a binder and a UV-absorbing agent and, if desired, additive such as a curing agent, a polymer latex and the like.

Any compound known in the art is useful as a UV-absorbing agent, such as a benzotriazole compound, a cinnamic ester compound, an aminoallylidene malonitrile compound, a benzophenone compound or the like.

The UV-absorbing agent to be used in the recording material of the present invention may be added to any layers as desired, especially to intermediate layers, after emulsifying and dispersing the agent using an oil drop dispersion method in water or a polymer dispersion method. In the case of the oil drop dispersion method, the UV-absorbing agent is initially dissolved in a high boiling point organic solvent having a boiling point of, for example 175° C. or higher, or in a so-called auxiliary solvent having a boiling point of, for example, from 30° to 160° C. or in a mixture thereof, and then dispersed in an aqueous medium such as water, an aqueous solution of gelatin, an aqueous solution of polyvinyl alcohol or the like in the presence of a surface active agent. Examples of high boiling point organic solvents are disclosed, for instance, in U.S. Pat. No. 2,322,027. Illustrative examples of high boiling point organic solvents and auxiliary solvents include the solvents for use in the preparation of microcapsules described above. The dispersion step may involve phase inversion. If necessary, the auxiliary solvent may be removed or reduced prior to coating using distillation, noodle washing, ultrafiltration and the like.

The procedures and effects of the latex dispersion method and illustrative examples of impregnation latexes are disclosed, for instance, in U.S. Pat. No. 4,199,363, OLS (German Patent Application) 2,541,274, OLS 2,541,230, JP-A-49-74538, JP-A-51-59943 and JP-A-54-32552, as well as in *Research Disclosure*, vol. 148, August, 1976, Item 14850. Suitable latexes for use in the present invention are a copolymer latex made of, for instance, an acrylic or a methacrylic ester (ethylacrylate, n-butylacrylate, n-butylmethacrylate, 2-acetoacetoxyethylmethacrylate or the like) and an acid monomer (acrylic acid, 2-acrylamide-2-methylpropanesulfonic acid or the like).

The most preferable UV-absorbing agent for use in the recording material of the present invention has a structure such that it hardly diffuses into the adjoining layer, a structure such as a polymer or a latex copolymerized with an UV-absorbing agent. These types of UV-absorbing agents are disclosed, for example, in European Patent 127,819, JP-A-59-68731, JP-A-59-26733, JP-A-59-23344, British Patent 2,118,315, JP-A-58-111942, U.S. Pat. No. 4,307,184, U.S. Pat. No. 4,202,836, U.S. Pat. No. 4,202,834, U.S. Pat. No. 4,207,253, U.S. Pat. No. 4,178,303, JP-A-47-560.

These UV-absorbing agents are added to an intermediate layer but, if desired, may be added to a protective layer, a light-sensitive heat-sensitive layer, an anti-halation layer and the like.

In the preparation of the recording material of the present invention, dispersion of the photo-hardenable composition and dispersion of the component(s) capable of undergoing color development or achromatization which are not microencapsulated are carried preferably using a water soluble polymer. Water soluble polymers suitable for use in the resent invention have a solubility of 5% by weight or more in water at 25° C. Preferred examples of such water soluble polymers include gelatin and gelatin derivatives. Further, another water soluble polymers such as proteins (e.g., albumin, casein and the like), cellulose derivatives (e.g., a methyl cellulose, a carboxymethyl cellulose and the like) sugar derivatives (e.g., a sodium alginate, a starch (including modified starches) and the like) gum arabic, synthetic polymers (e.g., a polyvinyl alcohol, a hydrolyzed product of a styrene-maleic anhydride copolymer, a carboxy-modified polyvinyl alcohol, a polyacryl amide, a saponified product of a vinyl acetate-polyacrylic acid copolymer, a polystyrene sulfonate and the like, can be used in combination with gelatin or the gelatin derivatives.

With regard to a binder to be added to each of the protective layer, light-sensitive heat-sensitive layer, intermediate layer and the like of the recording material of the present invention, the above-described water soluble polymers are also be useful, as well as solvent soluble polymers which include, for example, polystyrene, polyvinyl formal, polyvinyl butyral, acrylic resins such as polymethylacrylate, polybutylacrylate, polymethylmethacrylate, polybutylmethacrylate and their copolymers, phenol resins, styrene-butadiene resins, ethyl cellulose, epoxy resins, urethane resins and polymer latexes of these solvent soluble polymers, with most preferable polymers being gelatin and polyvinyl alcohol.

Various surfactants may be used in the recording material of the present invention, for example, as a coating aid, preventing electro static charging, improving sliding ability, enhancing emulsification and dispersion, preventing adhesion and the like. Such surfactants may be selected depending on the purpose from, for example: nonionic surfactants including saponin, polyethylene oxides and derivatives of polyethylene oxides such as a polyethylene oxide alkyl ether; anionic surfactants including alkyl sulfonates, alkylbenzene sulfonates, alkylnaphthalene sulfonates, alkyl sulfate esters, N-acyl-N-alkyltaurines, sulfosuccinate esters, sulfoalkylpolyoxyethylene alkylphenyl ether and the like; ampholytic surfactants including alkylbetaines, alkylsulfobetaines and the like; and cationic surfactants including aliphatic or aromatic quaternary ammonium salts and the like.

In addition to the above described additives, many other agents may be added, if desired, to the recording material of the present invention. Typical examples of the additive include irradiation- and halation-preventing dyes, UV-absorbing agents, plasticizers, fluorescent whitening agents, matting agents, coating aids, curing agents, antistatic agents, sliding improvers and the like as disclosed, for instance, in *Research Disclosure*, vol. 176, Item 17643 (December, 1978) and *Research Disclosure*, vol. 187, Item 18716 (November 1979).

The recording material of the present invention can be obtained by preparing coating solutions for use in the light-sensitive heat-sensitive layer and other layers dissolved in a suitable solvent, and coating and drying the coating solutions on an appropriate support. Solvents suitable for use for this purpose include: water; alcohols such as methanol, ethanol, n-propanol, isopropanol, n-butanol, sec-butanol, methyl cellosolve, 1-methoxy-2-propanol and the like; halogen based solvents such as methylene chloride, ethylene chloride and the like; ketones such as acetone, cyclohexanone, methyl ethyl ketone and the like; esters such as methyl cellosolve acetate, ethyl acetate, methyl acetate and the like; and toluene, xylene and the like; of which water is particularly preferred. These solvents may be used alone or as a mixture of two or more thereof.

Application of the coating solution to a support may be effected by the use of a blade coater, a rod coater, a knife coater, a roll doctor coater, a reverse roll coater, a transfer roll coater, a gravure coater, a kiss roll coater, a curtain coater, an extrusion coater or the like. Suitable application methods are disclosed, for example, in *Research Disclosure*, vol. 200, Item 20036 XV (December, 1980).

Further, application of the coating solutions to a support may also be effected by a simultaneous multicoating technique when the modified gelatin is employed as a protective colloid for preparing microcapsules containing at least one component capable of undergoing color development or achromatization, and all of the coating solutions are formulated in a gelatin system. Suitable simultaneous multicoating methods include a method described in *Shashin Kogaku no Kiso, Ginen Shashin Hen* (Basis of Photograph Engineering, Volume for Silver Halide Photographic), edited by the Society of Photographic science and Technology of Japan, the third captor; a multi-slide method as disclosed in U.S. Pat. No. 3,206,323; a curtain flow method as disclosed in U.S. Pat. No. 3,508,947; and the like.

The thickness of the light-sensitive heat-sensitive recording layer is preferably in the range of from 0.1 $\mu$m to 50 $\mu$m.

The recording material of the present invention can be used in applications such as a copying machine, a facsimile, a printer, a label, a color proof, an overhead projector, a secondary drawing and the like. Examples of suitable supports for these applications include paper materials such as paper, coated paper, laminated paper, synthetic paper and the like; transparent films such as polyethylene terephthalate film, cellulose triacetate film, polyethylene film, polystyrene film, polycarbonate film and the like; and metal plates such as those of aluminium, zinc, copper and the like; as well as modified products of these supports in which the surface of each material is treated using various techniques such as surface treatment, subbing, metal vaporization and the like. Also useful are those supports disclosed in *Research Disclosure*, vol. 200, Item 20036 XVII (December, 1980). A preferred thickness for these supports is in the range of from 50 to 200 $\mu$m.

These supports may be provided with a flatting surface layer on the front surface to cover and flatten unevenness of the surface of the support. The flatting surface layer may be formed by applying a polymer binder on the surface of the support in a conventional technique. As to the polymer binder, any of those having film-forming property can be used. Among them, gelatin is advantageous because application of the coating solutions to the support can be effected by the simultaneous multicoating technique when gelatin is selected as the material for the flatting surface layer. The thickness of the flatting surface layer preferably ranges from 0.2 to 10 $\mu$m. When it is thinner than the range, unevenness of the surface of the support is not sufficiently flattened. On the other hand, when it is thicker than the range, a large amount of the material is required to form it, thus it is disadvantageous.

These base materials for support use may be used after whitening by filling or coating them with a pigment.

Examples of pigments for filling purpose include silica, titanium dioxide, barium sulfate, calcium sulfate, barium carbonate, calcium carbonate, lithophone alumina white, zinc oxide, antimony trioxide, titanium phosphate and the like. These pigments may be used alone or as a mixture of two or more. Preferably, these pigments have a particle size of from 0.1 to 8 $\mu$m, and are used in an amount of from 1 to 30% based on the weight of the base material. For the purpose of dispersing these pigments in a resin, a metal soap such as zinc stearate, aluminium stearate or the like or other surface active agent is used as a dispersant.

These pigments are also useful for whitening by surface coating. Many water soluble, water dispersible and non-aqueous binders are useful in the preparation of support. These binders may be selected from those disclosed in *Saishin Bainda Gijutsu Binran* (Recent Binder Technique Manual) published by Sogo Gijutsu Center (in Japanese).

Examples of water soluble binders include gelatin, PVA, casein and the like, which are preferably used jointly with a curing agent. Useful water dispersible binders include butadiene copolymer latex, vinyl acetate resin emulsion, acryl emulsion, polyolefin-based emulsion and the like. As for non-aqueous binders, polyester-based, vinyl acetate-based, thermoplastic elastomer-based, polyurethane-based, melamine-based, urea-based, alkyd-based, acryl-based and phenol-based binders can be used.

In addition, these supports may be coated with additional layers depending on the purpose, such as an antihalation layer on the front surface and a sliding layer, an anti-static layer, a curl-prevention layer, an adhesive layer and the like on the back surface.

Since the recording material of the present invention has a high recording sensitivity over a broad range of wave lengths from ultraviolet light to visible light, various light sources can be used such as a mercury lamp, an ultra-high pressure mercury lamp, a mercury lamp of electrodeless discharge type, a xenon lamp, a tungsten lamp, a metal halide lamp, various lasers including argon laser, helium neon laser, semi-conductor laser and the like, as well as LED, a fluorescent lamp and other light sources for exposure.

Image recording can be performed by various means including contact exposure of copies such as a lith film, enlarged exposure of slides, liquid crystal images and the like, reflection exposure using reflected light from an original image, and other exposure means. Multicolor recording may be effected by single or multiple image recording using different wave lengths. Different wave lengths may be obtained either by changing light sources or by changing the optical filters.

A heat developing treatment is carried out simultaneously with or after the aforementioned image exposure of the recording material of the present invention. Many commonly used heating methods can be employed for the heat developing treatment. The heating temperature may generally be in the range of from 80° to 200° C., preferably from 100° to 160° C. The heating time may be in the range of from 1 second to 5 minutes, preferably from 3 seconds to 1 minute.

After the heat developing treatment, it is preferable to perform a total area exposure to cure the uncured parts. By the total area exposure, the life of images can be improved because of the inhibition of coloring reaction on the uncolored portion and achromatization reaction on the colored portion.

Examples of the present invention are given below by way of illustration and not by way of limitation. Unless otherwise indicated herein, all parts, percents, ratios, and the like are by weight.

EXAMPLES 1 TO 6 AND COMPARATIVE EXAMPLES 1 AND 2

Preparation of Coating Solutions 1-1 Preparation of capsules including electron donating colorless dye 1-1-a Preparation of capsules including electron donating colorless dye (1)

To 8.9 g of an electron donating colorless dye (1) dissolved in 16.9 g of ethyl acetate were added 20 g of Takenate D-110N (manufactured by Takeda Chemical Industries Ltd.) and 2 g of Millionate MR200 (manufactured by Nippon Polyurethane Industry Co., Ltd.) which are capsule-wall forming materials. The resulting solution was added to a mixture prepared from 42 g of an 8% solution of phthalate modified gelatin and 1.4 g of a 10% solution of sodium dodecylbenzene sulfonate and then subjected to emulsification and dispersion at 20° C. to obtain an emulsion. The thus obtained emulsion was mixed with 14 g of water and 72 g of a 2.9% aqueous solution of triethylenepentamine and heated at 60° C. with stirring. After 2 hours of heating, a suspension of capsules in which the electron donating colorless dye (1) was incorporated was obtained, with a mean particle size of 0.5 $\mu$m. When this suspension was filtrated through a filter mesh having a pore size of about 50 $\mu$m, any residues were not observed.

1-1-b Preparation of capsules including electron donating colorless dye

A suspension of capsules having a mean particle size of 0.5 μm in which an electron donating colorless dye (2) was incorporated was obtained by repeating the process of 1-1-a except that the electron donating colorless dye (1) used in 1-1-a was replaced by electron donating colorless dye (2).

1-1-c Preparation of capsules including electron donating colorless dye (3)

A suspension of capsules having a mean particle size of 0.5 μm in which an electron donating colorless dye (3) was incorporated was obtained by repeating the process of 1-1-a except that the electron donating colorless dye (1) used in 1-1-a was replaced by electron donating colorless dye (3).

1-1-d Preparation of capsules including electron donating colorless dye (3) and a high boiling point solvent A suspension of capsules having a mean particle size of 0.5 μm in which the electron donating colorless dye (3) and trimethylolpropanetrimethacrylate as a high boiling point solvent were incorporated was obtained by repeating the process of 1-1-c except that 10.4 g of ethyl acetate used in 1-1-c was replaced by a solvent mixture of 10.4 g of ethyl acetate as a low boiling point solvent and 12.4 g of trimethylolpropanetrimethacrylate as a high boiling point solvent.

1-2 Preparation of emulsion of photo-hardenable composition 1-2-a Emulsion of photo-hardenable composition (1)

In 3 g of isopropyl acetate were dissolved 0.13 g of a photopolymerization initiator (1), 0.1 g of a spectral sensitization dye (1) and 0.2 g of an auxiliary agent (1) to enhance polymerization. To this was added 5 g of a polymerizable electron accepting compound (1). The resulting solution was added to a mixture solution of 13 g of a 13% aqueous solution of gelatin, 0.8 g of a 2% aqueous solution of a surface active agent (1) and 0.8 g of a 2% aqueous solution of a surface active agent (2). Thereafter, the resulting mixture was emulsified using a homogenizer (manufactured by Nippon Seiki Co., Ltd.) at 10,000 rpm for 5 minutes to obtain an emulsion of a photo-hardenable composition (1).

1-2-b Emulsion of photo-hardenable composition (2)

An emulsion of a photo-hardenable composition (2) was obtained by repeating the process of 1-2-a except that 0.13 g of the photopolymerization initiator (1) and 0.1 g of the spectral sensitization dye (1) used in 1-2-a were replaced by 0.2 g of a photopolymerization initiator (2).

1-2-c Emulsion of photo-hardenable composition (3)

An emulsion of a photo-hardenable composition (3) was obtained by repeating the process of 1-2-a except that 0.13 g of the photopolymerization initiator (1) and 0.1 g of the spectral sensitization dye (1) used in 1-2-a were replaced by 0.2 g of a photopolymerization initiator (3).

1-2-d Emulsion of photo-hardenable composition (4)

In 4 g of ethyl acetate were dissolved 0.2 g of the photopolymerization initiator (1), 0.2 g of the spectral sensitization dye (1) and 0.2 g of N-phenylglycine ethyl ester as an auxiliary agent to enhance polymerization. To this were added 10 g of (1-methyl-2-phenoxy)ethyl resorcinate as an electron accepting compound and 8 g of trimethylolpropanetriacrylate monomer. The resulting solution was added to a mixed solution of 19.2 g of a 15% aqueous solution of gelatin, 4.8 g of water, 0.8 g of a 2% aqueous solution of the surface active agent (1) and 0.8 g of a 2% aqueous solution of the surface active agent (2). Thereafter, the resulting mixture was emulsified using a homogenizer (manufactured by Nippon Seiki Co., Ltd.) at 10,000 rpm for 5 minutes to obtain an emulsion of a photo-hardenable composition (4).

1-3 Preparation of emulsion of UV-absorbing agent 1-3-a Emulsion of UV-absorbing agents (1) and (2)

In 17.5 g of ethyl acetate were dissolved 7.5 g of a UV-absorbing agent (1) and 2.4 g of another UV-absorbing agent (2). The resulting solution was added to a mixed solution of 62 g of a 15% aqueous solution of gelatin and 1 g of a 62% aqueous solution of dodecylbenzenesulfonic acid. Thereafter, the resulting mixture was emulsificated using a homogenizer (manufactured by Nippon Seiki Co., Ltd.) at 10,000 rpm for 5 minutes to obtain an emulsion of UV-absorbing agents (1) and (2).

1-3-b Emulsion of ultraviolet ray absorbing agent (3)

A 5 g portion of an UV-absorbing agent (3) was dissolved in 19 g of ethyl acetate and the resulting solution was added to a mixed solution of 65 g of 15% aqueous solution of gelatin and 1 g of a 62% aqueous solution of dodecylbenzenesulfonic acid. Thereafter, the resulting mixture was emulsificated using a homogenizer (manufactured by Nippon Seiki Co., Ltd.) at 10,000 rpm for 5 minutes to obtain an emulsion of UV-absorbing agent (3).

1-4 Preparation of coating solution for use in light-sensitive heat-sensitive layer 1-4-a Coating solution for use in light-sensitive heat-sensitive layer (1)

A coating solution for use in light-sensitive heat-sensitive layer (1) was prepared by mixing 4 g of the capsules which included the electron donating colorless dye (1), obtained in 1-1-a above, with 12 g of the emulsion of the photo-hardenable composition (1) obtained in 1-2-a above and 12 g of a 15% aqueous solution of gelatin.

1-4-b Coating solution for use in light-sensitive heat-sensitive layer (2)

A coating solution for use in light-sensitive heat-sensitive layer (2) was prepared by mixing 4 g of the capsules which included the electron donating colorless dye (2) with 12 g of the emulsion of the photo-hardenable composition (2) obtained in 1-1-b above and 12 g of a 15% aqueous solution of gelatin.

1-4-c Coating solution for use in light-sensitive heat-sensitive layer (3)

A coating solution for use in light-sensitive heat-sensitive layer (3) was prepared by mixing 4 g of the capsules which included the electron donating colorless dye (3) obtained in 1-1-c above with 12 g of the emulsion of the photo-hardenable composition (3) obtained in 1-2-c above and 12 g of a 15% aqueous solution of gelatin.

1-4-d Coating solution for use in light-sensitive heat-sensitive layer (4)

A coating solution for use in light-sensitive heat-sensitive layer (4) was prepared by mixing 1 g of the capsules which included the electron donating colorless dye (1) obtained in 1-1-a above with 10 g of the emulsion of the photo-hardenable composition (4) obtained in 1-2-d above.

1-4-e Coating solution for use in light-sensitive heat-sensitive layer (3) containing a high boiling point solvent A coating solution for use in light-sensitive heat-sensitive layer (3) was prepared by mixing 4 g of the capsules which included the electron donating colorless dye (3) obtained in 1-1-b above and a high boiling point solvent with 12 g of the emulsion of the photo-hardenable composition (3) obtained in 1-2-c above and 12 g of 15% aqueous solution of gelatin.

1-5 Preparation of coating solution for use in intermediate layer 1-5-a Preparation of coating solution for use in intermediate layer (1)

A coating solution for use in intermediate layer (1) was prepared by mixing 9 g of distilled water with 14 g of the emulsion of the UV-absorbing agents (1), obtained in 1-3-a above, and (2) and 1.7 g of a 2% aqueous solution of a hardening agent (1).

1-5-b Preparation of coating solution for use in intermediate layer (2)

A coating solution for use in intermediate layer (2) was prepared by mixing 9 g of distilled water with 14 g of the emulsion of the UV-absorbing agent (2), obtained in 1-3-b above, and 1.7 g of a 2% aqueous solution of the hardening agent (1).

1-6 Preparation of coating solution for use in protective layer 1-6-a Coating solution for use in protective layer (1)

A coating solution for use in protective layer (1) was prepared by mixing 4.5 g of a 10% aqueous solution of gelatin, 4.5 g of distilled water, 0.5 g of a 2% aqueous solution of a surface active agent (3), 0.3 g of a 2% aqueous solution of a surface active agent (4), 0.5 g of a 2% aqueous solution of the hardening agent (1), a predetermined amount of Cycolloid 72 (manufactured by Fuji-Devison Chemical Ltd.) and 1 g of Snowtex N (manufactured by Nissan Chemical Industries, Ltd.). Cycolloid 72 was used in such an amount that the coating amount was 50 mg/m$^2$.

EXAMPLE 1

Positive Type Light-Sensitive Heat-Sensitive Recording Material

The coating solution for use in light-sensitive heat-sensitive layer (1) obtained in 1-4-a above was coated on the surface of a polyethylene terephthalate film having a thickness of 100 μm using a coating bar, in such an amount that the dry weight of the resulting layer was 8 g/m$^2$ and the coated solution was dried at 30° C. for 10 minutes. The surface of the thus coated layer was further coated with the coating solution for use in intermediate layer (1) obtained in 1-5-a above in such an amount that the dry weight of the resulting intermediate layer was 2 g/m$^2$ and then dried. The surface of the thus coated first intermediate layer was further coated with the coating solution for use in light-sensitive heat-sensitive layer (2) obtained in 1-4-b above in such an amount that the dry weight of the resulting light-sensitive heat-sensitive layer was 8 g/m$^2$ and then dried. The surface of the thus coated light-sensitive heat-sensitive layer was further coated with the coating solution for use in intermediate layer (2) obtained in 1-5-b above in such an amount that the dry weight of the resulting second intermediate layer became 2 g/m$^2$ and then dried. The surface of the thus coated second intermediate layer was further coated with the coating solution for use in light-sensitive heat-sensitive layer (3) obtained in 1-4-c above in such an amount that the dry weight of the resulting light-sensitive heat-sensitive layer was 8 g/m$^2$ and then dried. Finally, the surface of the thus coated light-sensitive heat-sensitive layer was further coated with the coating solution for use in protective layer (1) obtained in 1-6-a above using a coating bar in such an amount that the dry weight of the resulting protective layer became 2 g/m$^2$ and then dried at 30° C. for 10 minutes. In this way, the sample of Example 1 was obtained.

Through a lith film on which an image for yellow had been developed and an optical filter which cut out light of 410 nm or below (SC-41 filter, manufactured by Fuji Photo Film Co., Ltd.), the thus prepared light-sensitive heat-sensitive recording material was exposed to ultraviolet light using a 2,000 W high frequency lighting type ultra-high pressure mercury lamp (Printer P627GA, manufactured by Dainippon Screen Co., Ltd.). The thus treated recording material was then exposed to light of the mercury lamp through a lith film on which an image for magenta had been developed and through an interference filter which transmits only light of a wavelength of 365 to 400 nm. The resulting recording material was further exposed to light of the mercury lamp through a lith film on which an image for cyan had been developed and through an interference filter which transmits only light of a wavelength of 340 to 365 nm. A latent image was obtained in this way. When the UV-exposed recording material was heated at 120° C. for 5 seconds using a hot plate, a clear positive full-color image was obtained. The densities of the cyan, magenta and yellow in the non-image area were found to be 1.1, 1.2 and 0.9, respectively. Since the image thus formed was transparent, the projected image through an OHP projector was bright and clear.

REFERENTIAL EXAMPLE 1

Positive Type Light-Sensitive Heat-Sensitive Recording Material Containing a High Boiling Point Solvent A sample was prepared by repeating the process of Example 1 except that the coating solution (1-4-e) containing a high boiling point solvent for use in light-sensitive heat-sensitive layer (3) was used instead of the coating solution (1-4-c).

When the thus prepared recording material was subjected to exposure and then heated at 120° C. for 5 seconds using a hot plate in the same manner as in Example 1, a foul smell similar to that of trimethylolpropanetrimethacrylate was detected. In addition, the projected image through an OHP projector was dark.

EXAMPLE 2

Negative Type Light-Sensitive Heat-Sensitive Recording Material

The coating solution for use in light-sensitive heat-sensitive layer (4) obtained in 1-4-d above was coated on the surface of a polyethylene terephthalate film having a thickness of 100 μm using a coating bar, in such an amount that the dry weight of the resulting layer was 8 g/m$^2$ and the coated solution was dried at 30° C. for 10 minutes. The surface of the thus coated light-sensitive heat-sensitive layer was further coated with the coating solution for use in protective layer (1) obtained in 1-6-a above using a coating bar in such an amount that the dry weight of the resulting protective layer was 5 g/m$^2$ and then dried at 30° C. for 10 minutes. In this way, the sample of Example 2 was obtained.

Through a lith film on which an black-and-white image had been developed, the thus prepared light-sensitive heat-sensitive recording material was exposed to ultraviolet light using a 1,000 W high pressure mercury lamp (Jet Light, manufactured by Oak & Co., Ltd.). When the UV-exposed recording material was heated at 110° C. for 5 seconds using a hot plate, a clear magenta-colored negative image was obtained. The density of magenta in the non-image area was found to be 1.3.

EXAMPLES 3 TO 6 AND REFERENTIAL EXAMPLE 2

A series of suspensions of capsules were prepared basically repeating the procedure of Example 1 for the preparation of the capsules in which the electron donating colorless dye (1) obtained in 1-1-a above was incorporated. That is, a series of suspensions of capsules having a mean particle size of 0.5 μm in which the electron donating colorless dye (1) was incorporated were prepared by repeating the process of 1-1-a except that 10.4 g of ethyl acetate used in 1-1-a was replaced by the same amount of a solvent or a mixture of solvents as shown in Table 1 below.

Coating solutions for use in light-sensitive heat-sensitive layers were prepared using the thus obtained capsules in the same manner as in Example 1 and coated on the surface of a polyethylene terephthalate film having a thickness of 100 μm using a coating bar, in such an amount that the dry weight of the resulting layer was 8 g/m² and the coated solution was dried at 30° C. for 10 minutes.

The surface of the thus coated light-sensitive heat-sensitive layer was further coated with the coating solution for use in protective layer (1) obtained in 1-6-a above using a coating bar in such an amount that the dry weight of the resulting protective layer was 2 g/m² and then dried at 30° C. for 10 minutes. In this way, samples of Examples 3 to 6 and Referential Example 2 were obtained.

Through a lith film on which an image had been developed and though an optical filter which cut out light of 410 nm or below (SC-41 filter, manufactured by Fuji Photo Film Co., Ltd.), the thus prepared light-sensitive heat-sensitive recording materials were exposed to ultraviolet light using a 1,000 W high pressure mercury lamp (Jet Light, manufactured by Oak & Co., Ltd.). Thereafter, the UV-exposed recording materials were heated at 120° C. for 5 seconds using a hot plate. The results obtained are shown in Table 1.

TABLE 1

| | Solvent | Odor at Time of Heat Development | Results of Projection Using OHP |
|---|---|---|---|
| Example 3 | Methylene Chloride | No | Bright |
| Example 4 | Isopropyl Acetate | No | Bright |
| Example 5 | Methyl Propionate | No | Bright |
| Example 6 | 1/1 Mixture of Methylene Chloride and Ethyl Acetate | No | Bright |
| Referential Example 2 | Tricresyl Phosphate | Yes, though weak | Slightly dark |

The chemical structures of compounds used in the preparation of coating solutions above are shown below.

Electron Donating Colorless Dye (1)

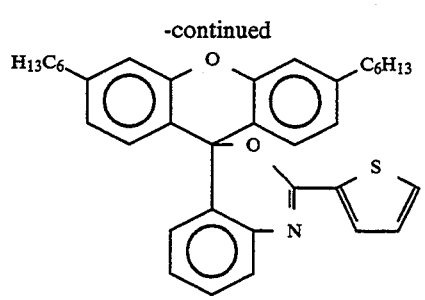

Electron Donating Colorless Dye (2)

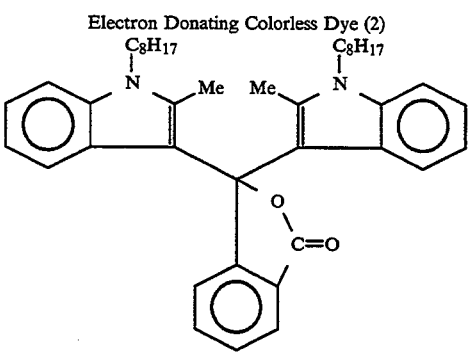

Electron Donating Colorless Dye (3)

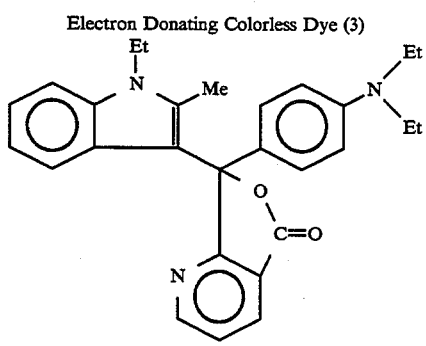

Polymerizable Electron Accepting Compound (1)

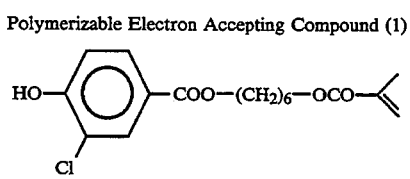

Photopolymerization Initiator (1)

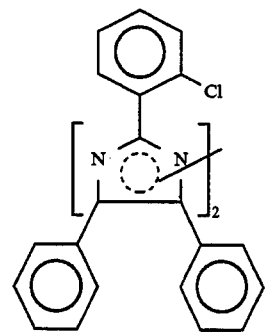

Photopolymerization Initiator (2)

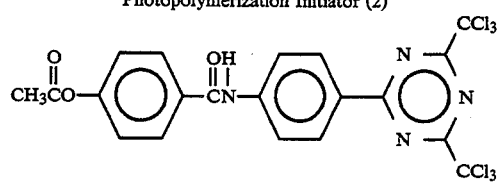

Photopolymerization Initiator (3)

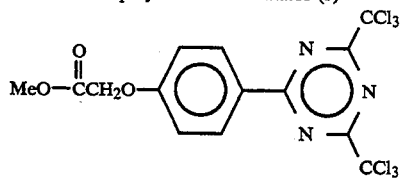

Spectral Sensitization Dye (1)

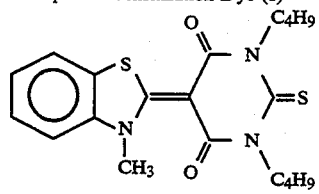

Auxiliary Agent (1)

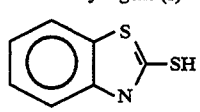

UV-Absorbing Agent (1)

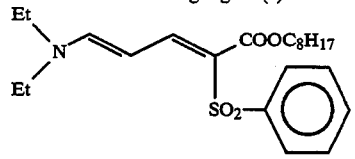

UV-Absorbing Agent (2)

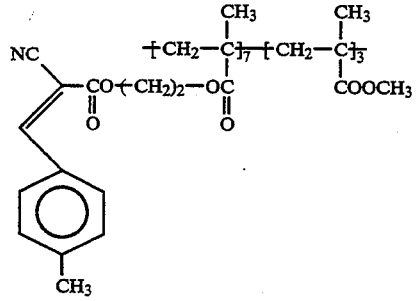

UV-Light Absorbing Agent (3)

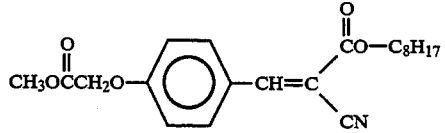

Hardening Agent (1)

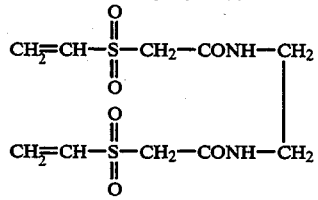

Surface Active Agent (1)

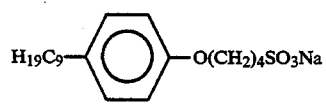

Surface Active Agent (2)

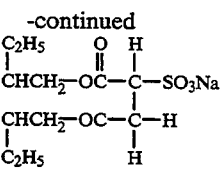

Surface Active Agent (3)

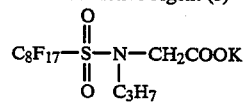

Surface Active Agent (4)

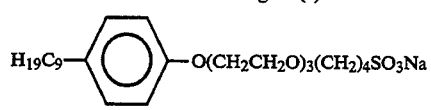

EXAMPLES 7 TO 10 AND REFERENTIAL EXAMPLES 3 AND 4

Preparation of Coating Solution 2-1 Preparation of capsules including electron donating colorless dye (1)

To 12.4 g of the above electron donating colorless dye (3) dissolved in 10.4 g of ethyl acetate were added 27 g of Takenate D-110N (manufactured by Takeda Chemical Industries Ltd.) and 3 g of Millionate MR200 (manufactured by Nippon Polyurethane Industry Co., Ltd.). The resulting solution was added to a mixture of 4.6 g of polyvinyl alcohol and 74 g of water and then subjected to emulsification and dispersion at 20° C. to obtain an emulsion. The thus obtained emulsion was mixed with 100 g of water and heated at 60° C. with stirring. After 2 hours of heating, a suspension of capsules in which the electron donating colorless dye (3) was incorporated as a core material was obtained, with a mean particle size of 0.5 μm.

2-2 Preparation of emulsion of photo-hardenable composition 2-2-a Emulsion of photo-hardenable composition (5)

In 3 g of ethyl acetate were dissolved 0.1 g of the above photopolymerization initiator (1), 0.05 g of the above spectral sensitization dye (1) and 0.2 g of N-phenylglycine ethyl ester as an auxiliary agent to enhance polymerization. To this was then added 8 g of the above polymerizable electron accepting compound (1). The resulting solution was added to a mixed solution of 9.6 g of a 7.5% aqueous solution of PVA, 0.8 g of a 2% aqueous solution of the above surface active agent (1) and 0.8 g of a 2% aqueous solution of another surface active agent (5). Thereafter, the resulting mixture was emulsified using a homogenizer (manufactured by Nippon Seiki Co., Ltd.) at 10,000 rpm for 5 minutes to obtain an emulsion of photo-hardenable composition (5).

2-2-b Emulsion of photo-hardenable composition (6)

In 4 g of ethyl acetate were dissolved 0.2 g of the above photopolymerization initiator (1), 0.2 g of the above spectral sensitization dye (1) and 0.2 g of N-phenylglycine ethyl ester as an auxiliary agent to enhance polymerization. To this were added 10 g of (1-methyl-2-phenoxy)ethyl resorcinate as an electron accepting compound and 8 g of trimethylolpropanetriacrylate monomer. The resulting solution was added to a mixed solution of 19.2 g of a 15% aqueous solution of poly vinyl alcohol (PVA), 4.8 g of water, 0.8 g of a 2% aqueous solution of the aforementioned surface active agent (1) and 0.8 g of a 2% aqueous solution of surface active agent (5). The resulting mixture was emulsified using a homogenizer (manufactured by Nippon Seiki Co., Ltd.) at 10,000 rpm for 5 minutes to obtain an emulsion of photo-hardenable composition (6).

2-3 Preparation of coating solution for use in positive type light-sensitive heat-sensitive layer A coating solution for use in a positive type light-sensitive heat-sensitive layer (5) was prepared by mixing 4 g of the capsules (2-1) which included electron donating colorless dye (1) with 12 g of the emulsion (2-2-a) of photo-hardenable composition (5) and 12 g of 15% aqueous solution of PVA.

2-4 Preparation of coating solution for use in negative type light-sensitive heat-sensitive layer A coating solution for use in negative type light-sensitive heat-sensitive layer (6) was prepared by mixing 1 g of the capsules (2-1) which included the electron donating colorless dye (1) with 10 g of the emulsion (2-2-b) of the photo-hardenable composition (6).

2-5 Preparation of coating solution for use in protective layer

A coating solution for use in protective layer (3) was prepared by mixing 4.5 g of a 10% aqueous solution of gelatin with 1.5 g of distilled water, 0.5 g of a 2% aqueous solution of surface active agent (3), a 1.5 g of a 1% aqueous solution of sodium 2,4-dichloro-6-hydroxy-s-triazine, a predetermined amount of Cycolloid 72 (manufactured by Fuji-Devison Chemical Ltd.) and 1 g of Snowtex N. Cycolloid 72 was used in such an amount that the coating amount was 50 mg/m².

The structure of surface active agent (5) used in the above coating solutions is shown below.

Surface Active Agent (5)

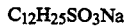

$C_{12}H_{25}SO_3Na$

Preparation and evaluation of light-sensitive heat-sensitive recording material

EXAMPLE 7

Positive Type Light-Sensitive Heat-Sensitive Recording Material

The coating solution for use in light-sensitive heat-sensitive layer (5) obtained in 2-3 above was coated on the surface of a polyethylene terephthalate film having a thickness of 100 μm using a coating bar, in such an amount that the dry weight of the resulting layer was 8 g/m² and the coated solution was dried at 30° C. for 10 minutes. The surface of the thus coated light-sensitive heat-sensitive layer was further coated with the coating solution for use in the protective layer (3) obtained in 2-5 above using a coating bar in such an amount that the dry weight of the resulting protective layer was 2 g/m² and then dried at 30° C. for 10 minutes. In this way, the sample of Example 7 was obtained.

Through a lith film on which an image for cyan had been developed and an optical filter which cut out light of 410 nm or below (SC-41 filter, manufactured by Fuji Photo Film Co., Ltd.), the thus prepared light-sensitive heat-sensitive recording material was exposed to ultraviolet light using a 1,000 W high pressure mercury lamp (Jet Light, manufactured by Oak & Co., Ltd.). When the UV-exposed recording material was heated at 110° C. for 5 seconds using a hot plate, a clear cyan-color image was obtained with a high resolution power and no turbid.

EXAMPLE 8

Negative Type Light-Sensitive Heat-Sensitive Recording Material

The coating solution for use in light-sensitive heat-sensitive layer (6) obtained in 2-4 above was coated on the surface of a polyethylene terephthalate film having a thickness of 100 μm using a coating bar, in such an amount that the dry weight of the resulting layer was 8 g/m² and the coated solution was dried at 30° C. for 10 minutes. The surface of the thus coated light-sensitive heat-sensitive layer was further coated with coating solution for use in protective layer (3) obtained above using a coating bar in such an amount that the dry weight of the resulting protective layer was 5 g/m² and then dried at 30° C. for 10 minutes. In this way, a negative type light-sensitive heat-sensitive recording material was obtained.

Through a lith film on which an black-and-white image had been developed, the thus prepared light-sensitive heat-sensitive recording material was exposed to ultraviolet light using a 1,000 W high pressure mercury lamp (Jet Light, manufactured by Oak & Co., Ltd.). When the UV-exposed recording material was heated at 110° C. for 5 seconds using a hot plate, a clear cyan-colored negative image was obtained with a high resolution power and no turbid.

EXAMPLES 9 AND 10 AND REFERENTIAL EXAMPLES 3 AND 4

A series of microcapsule suspensions with varying particle sizes were prepared by basically repeating the procedure described in section 2-1 above "Preparation of capsules including electron donating achromatic dye".

More specifically, a series of microcapsule suspensions having different particle sizes as shown in Table 2 below were prepared by changing the emulsification conditions at the time of microcapsule preparation. Light-sensitive heat-sensitive recording materials were obtained from the thus prepared microcapsule suspensions and subjected to exposure and image development in the same manner as in Example 7. The Results of the evaluation are shown in Table 2 below.

TABLE 2

| | Mean Particle Size of Microcapsules | Resolution of Image | Clearness of Image |
|---|---|---|---|
| Example 9 | 0.9 μm | Almost good | Almost good |
| Example 10 | 1.5 μm | Almost good | Almost good |
| Referential Example 3 | 2.5 μm | Little bad | Little turbid |
| Referential Example 4 | 6 μm | Markedly bad | Wholly turbid, rough surface |

EXAMPLES 11 TO 14 AND REFERENTIAL EXAMPLE 5

Positive Type Light-Sensitive Heat-Sensitive Recording Material

Light-sensitive heat-sensitive recording materials were prepared using the following supports A to E.

1. Support A:

Wood pulp consisting of 20 parts LBSP and 80 parts LBKP was beaten to a Canadian freeness of 300 cm³ using a disc refiner. To this were added 1.0 part of sodium stearate, 0.5 part of an anionic polyacrylamide, 1.5 parts of aluminium sulfate and 0.5 part of polyamide polyamine epichlorohydrin on the basis of dry weight of the wood pulp. The resulting mixture was then made into paper having a basis weight of 80 g/m² using a Fourdrinier paper machine. The density was set to 1.0 g/cm³ using a machine calender.

After subjecting the resulting paper to corona discharge the paper was laminated with a polyethylene resin layer having a thickness of 20 μm, by coating one side of the paper with a low density polyethylene (MI=7 g/10 min; density=0,923 g/cm³) containing 10% by weight of titanium oxide using an extrusion coating. Thereafter, the other side of the paper (backside) was subjected to corona discharge and then laminated with a polyethylene resin layer having a thickness of 20 μm, by coating the backside with a high density polyethylene (MI=8 g/10 min; density=0.950 g/cm³) using extrusion coating. In this way, a paper support with both sides laminated with polyethylene layers was obtained.

2. Support B:

Lumilar E-60 (100 μm in thickness) manufactured by Toray Industries, Inc. (A polyester film filled with a white pigment)

3. Support C:

Lumilar E-20 (38 μm in thickness) manufactured by Toray Industries, Inc. (A polyester film filled with a white pigment)

4. Support D:

Merinex 990 (184 μm in thickness) manufactured by ICI (A polyester film filled with a white pigment (barium sulfate))

5. Support E:

Yupo FPG (110 μm in thickness) manufactured by Oji Paper Co., Ltd. (A polyester film filled with a white pigment)

Onto the front surface of Support A, a gelatin solution was coated with a coating bar to provide a flatting surface layer. The dry film thickness of the flatting surface layer was controlled to 0.3 μm (Example 11), 0.5 μm (Example 12), 1 μm (Example 13) or 2 μm (Example 14) by adjusting the concentration of the gelatin solution and the coating bar. In Comparative Example 5, the support was not provided with any flatting surface layer.

The coating solution obtained in section 1-4-a above for use in the light-sensitive heat-sensitive layer (1) was coated on the surface of Support A using a coating bar, in such an amount that the dry weight of the resulting layer was 8 g/m² and the coated solution was dried at 30° C. for 10 minutes. The surface of the thus coated layer was further coated with the coating solution for use in the intermediate layer (1) obtained in 1-5-a above in such an amount that the dry weight of the resulting intermediate layer was 2 g/m² and then dried. The surface of the thus coated first intermediate layer was further coated with coating solution for use in light-sensitive heat-sensitive layer (2) obtained 1-4-b above in such an amount that the dry weight of the resulting light-sensitive heat-sensitive layer was 8 g/m² and then dried. The surface of the thus coated light-sensitive heat-sensitive layer was further coated with coating solution for use in intermediate layer (2) obtained in 1-5-b above in such an amount that the dry weight of the resulting second intermediate layer was 2 g/m² and then dried. The surface of the thus coated second intermediate layer was further coated with coating solution for use in light-sensitive heat-sensitive layer (3) obtained in 1-4-c above in such an amount that the dry weight of the resulting light-sensitive heat-sensitive layer was 8 g/m² and then dried. Finally, the surface of the thus coated light-sensitive heat-sensitive layer was further coated with coating solution for use in the protective layer (1) obtained in 1-6-a above using a coating bar in such an amount that the dry weight of the resulting protective layer was 2 g/m² when dried at 30° C. for 10 minutes. In this way, samples of this invention and Referential Examples were obtained.

Through a lith film on which an image for yellow had been developed and an optical filter which cut out light of 410 nm or below (SC-41 filter, manufactured by Fuji Photo Film Co., Ltd.), the thus prepared light-sensitive heat-sensitive recording material was exposed to ultraviolet light using a 2,000 W high frequency lighting type ultra-high pressure mercury lamp (Printer P627GA, manufactured by Dainippon Screen Co., Ltd.). The thus treated recording material was then exposed to light of the mercury lamp through a lith film on which an image for magenta had been developed and through an interference filter which transmits only light of a wavelength of 365 to 400 nm. The resulting recording material was further exposed to light of the mercury lamp through a lith film on which an image for cyan use had been developed and through an interference filter which transmits only light of a wavelength of 340 to 365 nm. A latent image was obtained in this way. Thereafter, the UV-exposed recording material was heated at 120° C. for 5 seconds using a hot plate.

In this instance, heat development was carried out 10 minutes after exposure, resolution, density evenness and degree of fogging in terms of OD (yellow density measured using a reflection density meter, RD 91, manufactured by MACBETH) of the resulting images was evaluated with the results shown in Table 3 below.

TABLE 3

| | | Results of Evaluation | | |
|---|---|---|---|---|
| | Support | Thickness of Flatting Surface Layer (μm) | Resolution | Density Evenness | Fogging OD |
| Example 11 | A | 0.3 | slightly good | slightly good | good 0.23 |
| Example 12 | A | 0.5 | good | good | good 0.15 |
| Example 13 | A | 1 | very good | very good | good 0.13 |
| Example 14 | A | 2 | very good | very good | good 0.14 |
| Referential Example 5 | A | 0 | bad | bad | bad 0.30 |

EXAMPLES 15 TO 18 AND REFERENTIAL EXAMPLES 6 AND 7

Negative Type Light-Sensitive Heat-Sensitive Recording Material

The coating solution obtained in section 1-4-d above for use in light-sensitive heat-sensitive layer (4) was coated on the surface of each of the supports shown below in Table 4 using a coating bar, in such an amount that the dry weight of the resulting layer was 8 g/m² and the coated solution was dried at 30° C. for 10 minutes. The surface of the thus coated light-sensitive heat-sensitive layer was further coated with coating solution for use in protective layer (1) obtained in 1-6-a above using a coating bar in such an amount that the dry weight of the resulting protective layer was 5 g/m² and then dried at 30° C. for 10 minutes. In this way, samples of the invention and Referential Examples were obtained.

Through a lith film on which a black-and-white image had been developed, the thus prepared light-sensitive heat-sensitive recording material was exposed to ultraviolet light using a 1,000 W high pressure mercury lamp (jet Light, manufactured by Oak & Co., Ltd.). After subjecting to exposure, evaluation was carried out in the same manner as in Example 11, with the results shown in Table 4 being obtained.

TABLE 4

| | | Results of Evaluation | | | |
|---|---|---|---|---|---|
| | Support | Thickness of Flatting Surface Layer (μm) | Resolution | Density Evenness | Fogging OD |
| Example 15 | A | 0.3 | slightly good | slightly good | good 0.23 |
| Example 16 | A | 0.5 | good | good | good 0.15 |
| Example 17 | A | 1 | very good | very good | good 0.13 |
| Example 18 | A | 2 | very good | very good | good 0.14 |
| Referential Example 6 | A | 0 | bad | bad | bad 0.30 |

EXAMPLE 19

The coating solution obtained in section 1-4-a above for use in the light-sensitive heat-sensitive layer (1) was coated on the surface of Support A obtained in Examples 11 to 14 using a coating bar, in such an amount that the dry weight of the resulting layer was 8 g/m² and the coated solution was dried at 30° C. for 10 minutes. The surface of the thus coated layer was further coated with coating solution for use in intermediate layer (1) obtained in section 1-5-a above in such an amount that the dry weight of the resulting intermediate layer was 2 g/m² and then dried. The surface of the thus coated first intermediate layer was further coated with coating solution for use in the light-sensitive heat-sensitive layer (2) obtained in section 1-4-b above in such an amount that the dry weight of the resulting light-sensitive heat-sensitive layer was 8 g/m² and then dried. The surface of the thus coated light-sensitive heat-sensitive layer was further coated with coating solution for use in the intermediate layer (2) obtained in section 1-5-b above in such an amount that the dry weight of the resulting second intermediate layer was 2 g/m² and then dried. The surface of the thus coated second intermediate layer was further coated with coating solution for use in the light-sensitive heat-sensitive layer (3) obtained in section 1-4-c above in such an amount that the dry weight of the resulting light-sensitive heat-sensitive layer was 8 g/m² and then dried. Finally, the surface of the thus coated light-sensitive heat-sensitive layer was further coated with coating solution for use in the protective layer (1) obtained in section 1-6-a above using a coating bar in such an amount that the dry weight of the resulting protective layer was 2 g/m² and then dried at 30° C. for 10 minutes. In this way, samples of Example 19 was obtained.

Through a lith film on which an image for yellow had been developed and an optical filter which cut out light of 410 nm or below (SC-41 filter, manufactured by Fuji Photo Film Co., Ltd.), the thus prepared light-sensitive heat-sensitive recording material was exposed to ultraviolet light using a 2,000 W high frequency lighting type ultra-high pressure mercury lamp (Printer P627GA, manufactured by Dainippon Screen Co., Ltd.). The thus treated recording material was then exposed to light of the mercury lamp through a lith film on which an image for magenta had been developed and through an interference filter which transmits only light of a wavelength of 365 to 400 nm. The resulting recording material was further exposed to light of the mercury lamp through a lith film on which an image for cyan had been developed and through an interference filter which transmits only light of a wavelength of 340 to 365 nm. A latent image was obtained in this way. Thereafter, the UV-exposed recording material was heated at 120° C. for 5 seconds using a hot plate. As a result, a clear full-color positive image where the OD value (reflection density) of each color was about 2.0 was obtained. Any unevenness of density of image or repellence or flocculation of the coating solutions were not observed on the surface of the recording material.

EXAMPLE 20

Coating solution prepared in the same manner as in section 1-4-d above except that capsules which included the electron donating colorless dye (1) was replaced by capsules which included the electron donating colorless dye (3) obtained in section 1-1-c, was coated on the surface of a support using a coating bar, in such an amount that the dry weight of the resulting layer was 8 g/m² and then dried at 30° C. for 10 minutes. The surface of the thus coated layer was coated with coating solution for use in intermediate layer (1) obtained in section 1-5-a above using a coating bar in such an amount that the dry weight of the resulting layer was 5 g/m² and then dried at 30° C. for 10 minutes. In this way, a sample of Example 20 was obtained.

Through a lith film on which a back-and-white image had been developed, the thus prepared light-sensitive heat-sensitive recording material was exposed to ultraviolet light using 2,000 W high pressure mercury lamp (jet light, manufactured by ORC Co., Ltd.). Thereafter, the exposed recording material was heated at 120° C. for 5 seconds using a hot plate. As a result, a clear negative monocolor (cyan) image was obtained.

EXAMPLES 21 AND 22

Capsules were prepared in the same manner as in section 1-1-a except that the 8% aqueous solution of phthalate modified gelatin was replaced by an 8% aqueous solution of acetylate modified gelatin (Example 21) or an 8% aqueous solution of succinate modified gelatin (Example 22). As a result, stable suspensions of capsules were obtained as in section 1-1-a and any residues were not observed when they were filtrated.

Further, the same procedures were repeated except that the electron donating colorless dye (1) was replaced by the above-mentioned electron donating colorless dye (2) or (3). As a result, similar good results were obtained.

REFERENTIAL EXAMPLE 7

The procedure of section 1-1-a was repeated except that the 8% aqueous solution of phthalate modified gelatin was replaced by an 8% aqueous solution of unmodified gelatin. As a result, flocculation occurred within few minutes from the beginning of emulsification and dispersion and thereby the following capsulation reaction could not be carried out any more and the resulting mixture could not be filtrated at all.

Further, the same procedures were repeated except that the electron donating colorless dye (1) was replaced by the above-mentioned electron donating colorless dye (2) or (3). As a result, similar results occurred.

Since high boiling point solvents which are usually used at the time of the prior art microcapsule formation process are not used in the recording material of the present invention, evaporation of toxic solvents does not occur when the inventive recording material of the present invention is subjected to heat development. Also, by the use of the recording material of the present invention, formation of haze can be reduced to such a low level that the material can be used in projection type applications such as OHP, slide and the like. For example, when images developed on the recording material of the invention were projected on a screen using an OHP, the projected images were quite bright showing no scattering of light.

In addition, with using microcapsules having markedly small particle sizes, small picture elements can be obtained thereby rendering possible formation of high resolution images. Also, as a result of the reduction of the particle size of microcapsules, scattering in light inside the recording layers can be repressed and therefore clear images can be obtained.

Moreover, according to the present invention, a recording material which does not show reduced resolving power and uneven image density, which usually occurs by uneven support surface, can be provided. Such an effect was attained by the use of a polyester support in which a white pigment was filled. Because of this, a clear high visibility image can be obtained by the use of the recording material of the present invention.

Still further, microcapsules having markedly small particle size can be obtained in the method of the present invention without occurrence of flocculation. Also, a light-sensitive heat-sensitive recording material which gives a clear image without uneven image density can be obtained by using microcapsules prepared in the method of the present invention.

While the invention has been described in detail and with reference to specific embodiments thereof, it will be apparent to one skilled in the art that various changes and modifications can be made therein without departing from the spirit and scope thereof.

What is claimed is:

1. A light-sensitive heat-sensitive recording material in which a latent image is formed upon exposure in a photo-hardenable composition and, when heated, a component capable of undergoing color development or achromatization moves inside the light-sensitive heat-sensitive material in response to the latent image to form an image, wherein said light-sensitive heat-sensitive recording material comprises a support having on at least one side thereof a light-sensitive heat-sensitive layer comprising a photo-hardenable composition and microcapsules containing at least one component capable of undergoing color development or achromatization, said microcapsules resulting from a solution containing at least one component capable of undergoing color development or achromatization as a core material of the microcapsules and a volatile solvent which has a water solubility of 10% by volume or less and has a low boiling point such that it volatilizes during a process for preparing said light-sensitive heat-sensitive recording material leaving substantially no trace of the solvent in the resulting recording material, wherein said solution further contains a modified gelatin as a protective colloid, wherein said photo-hardenable composition is a photopolymerizable composition which comprises a compound containing an electron accepting moiety and a polymerizable vinyl monomer moiety in the same molecule and a photopolymerization initiator.

2. The light-sensitive heat-sensitive recording material according to claim 1, wherein said volatile solvent has a boiling point of 100° C. or below.

3. The light-sensitive heat-sensitive recording material according to claim 1, wherein said microcapsules have a mean particle size of 2 µm or less.

4. The light-sensitive heat-sensitive recording material of claim 1, wherein said support is a polyester support filled with a white pigment and provided with a flatting surface layer.

5. A light-sensitive heat-sensitive recording material in which a latent image is formed upon exposure in a photo-hardenable composition contained outside of microcapsules and, when heated, an electron accepting compound moves inside the light-sensitive heat-sensitive material in response to the latent image to form an image by developing a color of an electron donating colorless dye present in microcapsules, wherein said light-sensitive heat-sensitive recording material comprises a support having on at least one side thereof a light-sensitive heat-sensitive layer comprising a photo-hardenable composition and microcapsules resulting from a solution containing at least one electron donating colorless dye as a core material of the microcapsules and a volatile solvent which has a water solubility of 10% by volume or less and has a low boiling point such that it volatilizes during a process for preparing said light-sensitive heat-sensitive recording material leaving substantially no trace of the solvent in the resulting recording material, wherein said solution further contains a modified gelatin as a protective colloid, wherein said photo-hardenable composition is a photopolymerizable composition which comprises a compound containing an electron accepting moiety and a polymerizable vinyl monomer moiety in the same molecule and a photopolymerization initiator.

6. The light-sensitive heat-sensitive recording material according to claim 5, wherein said volatile solvent has a boiling point of 100° C. or below.

7. The light-sensitive heat-sensitive recording material according to claim 5, wherein said microcapsules have a mean particle size of 2 µm or less.

8. The light-sensitive heat-sensitive recording material of claim 5, wherein said support is a polyester support filled with a white pigment and provided with a flatting surface layer.

9. The light-sensitive heat-sensitive recording material according to any of claims 1 and 2, wherein said light-sensitive heat-sensitive recording material is a multicolor recording material.

10. The light-sensitive heat-sensitive recording material according to claim 9, wherein said light-sensitive heat-sensitive recording material comprises a layer structure of at least two light-sensitive heat-sensitive layers laminated on a support, said layer structure comprising a first light-sensitive heat-sensitive layer which is sensitive to light of a central wave length of λ1, an intermediate layer which absorbs light of a central wave length of $\lambda 1$, a second light-sensitive heat-sensitive layer which is sensitive to light of a central wave length of $\lambda 2$ and develops a different color from the first light-sensitive heat-sensitive layer, an intermediate layer which absorbs light of a central wave length of $\lambda i$-1 and an i-th light-sensitive heat-sensitive layer which is sensitive to light of a central wave length of $\lambda i$ and develops a different color from the first, second and (i-1)-th light-sensitive heat-sensitive layers, in that order from the side of exposure light toward the support side of the recording material, said central wave lengths being in the order of $\lambda 1 < \lambda 2 < \ldots < \lambda i$ where i is an integer of 2 or more.

11. The light-sensitive heat-sensitive recording material according to claim 10, wherein said material further contains an intermediate layer which absorbs light of a central wave length $\lambda 2$ and a third light-sensitive heat-sensitive layer which is sensitive to light of a central wave length $\lambda 3$, and wherein all of the central wave lengths $\lambda 1$, $\lambda 2$ and $\lambda 3$ of said light-sensitive heat-sensitive layers are 320 nm or more, both $\lambda 1$ and $\lambda 2$ are less than 400 nm and $\lambda 3$ is 400 nm or more.

* * * * *